(12) United States Patent
Mukhanov et al.

(10) Patent No.: US 9,853,645 B1
(45) Date of Patent: Dec. 26, 2017

(54) LOW-POWER BIASING NETWORKS FOR SUPERCONDUCTING INTEGRATED CIRCUITS

(71) Applicant: Hypres, Inc., Elmsford, NY (US)

(72) Inventors: Oleg A. Mukhanov, Putnam Valley, NY (US); Alexander F. Kirichenko, Pleasantville, NY (US); Dimitri Kirichenko, Yorktown Heights, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 15/290,583

(22) Filed: Oct. 11, 2016

Related U.S. Application Data

(63) Continuation of application No. 14/996,926, filed on Jan. 15, 2016, now Pat. No. 9,473,124, which is a continuation of application No. 14/064,267, filed on Oct. 28, 2013, now Pat. No. 9,240,773, which is a continuation of application No. 12/902,572, filed on Oct. 12, 2010, now Pat. No. 8,571,614.

(60) Provisional application No. 61/250,838, filed on Oct. 12, 2009, provisional application No. 61/369,927, filed on Aug. 2, 2010.

(51) Int. Cl.
 *H03K 19/195* (2006.01)
(52) U.S. Cl.
 CPC .................. *H03K 19/195* (2013.01)
(58) Field of Classification Search
 CPC .................................................. H03K 19/195
 See application file for complete search history.

(56) References Cited

U.S. PATENT DOCUMENTS

| | | |
|---|---|---|
| 3,949,395 A | 4/1976 | Klein |
| 3,953,749 A | 4/1976 | Baechtold et al. |
| 3,970,965 A | 7/1976 | Shapiro et al. |
| 3,987,309 A | 10/1976 | Hamel et al. |
| 4,012,642 A | 3/1977 | Gueret |
| 4,051,393 A | 9/1977 | Fulton |
| 4,097,765 A | 6/1978 | Zappe |
| 4,107,554 A | 8/1978 | Yao |
| 4,109,169 A | 8/1978 | Tantraporn et al. |
| 4,109,522 A | 8/1978 | Thompson |
| 4,117,354 A | 9/1978 | Geewala |
| 4,145,699 A | 3/1979 | Hu et al. |
| 4,168,441 A | 9/1979 | McDonald et al. |
| 4,176,290 A | 11/1979 | Ishida et al. |
| 4,181,902 A | 1/1980 | Scott |
| 4,186,441 A | 1/1980 | Baechtold et al. |
| 4,227,096 A | 10/1980 | Frosch et al. |
| 4,245,169 A | 1/1981 | Hamilton |

(Continued)

*Primary Examiner* — Colleen Dunn
(74) *Attorney, Agent, or Firm* — Steven M. Hoffberg; Tully Rinckey PLLC

(57) ABSTRACT

A superconducting integrated circuit, comprising a plurality of superconducting circuit elements, each having a variation in operating voltage over time; a common power line; and a plurality of bias circuits, each connected to the common power line, and to a respective superconducting circuit element, wherein each respective bias circuit is superconducting during at least one time portion of the operation of a respective superconducting circuit element, and is configured to supply the variation in operating voltage over time to the respective superconducting circuit element.

20 Claims, 13 Drawing Sheets

(56) References Cited

U.S. PATENT DOCUMENTS

| | | |
|---|---|---|
| 4,249,094 A | 2/1981 | Fulton |
| 4,275,314 A | 6/1981 | Fulton |
| 4,330,841 A | 5/1982 | Yamada et al. |
| 4,342,924 A | 8/1982 | Howard et al. |
| 4,344,052 A | 8/1982 | Davidson |
| 4,361,768 A | 11/1982 | Rajeevakumar |
| 4,371,796 A | 2/1983 | Takada |
| 4,373,138 A | 2/1983 | Fulton et al. |
| 4,400,631 A | 8/1983 | Fulton |
| 4,401,900 A | 8/1983 | Faris |
| 4,403,189 A | 9/1983 | Simmonds |
| 4,423,430 A | 12/1983 | Hasuo et al. |
| 4,468,635 A | 8/1984 | Lukens et al. |
| 4,470,023 A | 9/1984 | Lukens et al. |
| 4,482,821 A | 11/1984 | Houkawa et al. |
| 4,496,854 A | 1/1985 | Chi et al. |
| 4,506,166 A | 3/1985 | Sone |
| 4,506,172 A | 3/1985 | Hasuo |
| 4,509,018 A | 4/1985 | Gershenson |
| 4,509,146 A | 4/1985 | Wang et al. |
| 4,521,682 A | 6/1985 | Murakami et al. |
| 4,533,840 A | 8/1985 | Gheewala et al. |
| 4,538,077 A | 8/1985 | Sone |
| 4,544,937 A | 10/1985 | Kroger |
| 4,551,704 A | 11/1985 | Anderson |
| 4,554,567 A | 11/1985 | Jillie et al. |
| 4,555,643 A | 11/1985 | Kotera et al. |
| 4,559,459 A | 12/1985 | Wang et al. |
| 4,567,383 A | 1/1986 | Goto et al. |
| 4,567,438 A | 1/1986 | Gershenson et al. |
| 4,578,691 A | 3/1986 | Murakami et al. |
| 4,585,999 A | 4/1986 | Hilbert et al. |
| 4,589,001 A | 5/1986 | Sakai et al. |
| 4,611,132 A | 9/1986 | Sone |
| 4,626,701 A | 12/1986 | Harada et al. |
| 4,630,005 A | 12/1986 | Clegg et al. |
| 4,631,423 A | 12/1986 | Faris |
| 4,638,185 A | 1/1987 | Kobayashi et al. |
| 4,638,257 A | 1/1987 | McDonald |
| 4,646,060 A | 2/1987 | Phillips et al. |
| 4,672,244 A | 6/1987 | Harada et al. |
| 4,678,945 A | 7/1987 | Sugano et al. |
| 4,687,987 A | 8/1987 | Kuchnir et al. |
| 4,710,651 A | 12/1987 | Suzuki |
| 4,713,562 A | 12/1987 | Hasuo et al. |
| 4,733,182 A | 3/1988 | Clarke et al. |
| 4,748,630 A | 5/1988 | Nagashima |
| 4,749,888 A | 6/1988 | Sakai et al. |
| 4,764,898 A | 8/1988 | Miyahara et al. |
| 4,777,443 A | 10/1988 | Yabusaki et al. |
| 4,785,426 A | 11/1988 | Harada et al. |
| 4,789,794 A | 12/1988 | Whiteley et al. |
| 4,812,689 A | 3/1989 | Whiteley |
| 4,814,598 A | 3/1989 | Faris |
| 4,823,026 A | 4/1989 | Hanson |
| 4,837,604 A | 6/1989 | Faris |
| 4,847,514 A | 7/1989 | Ueda et al. |
| 4,866,302 A | 9/1989 | Whiteley et al. |
| 4,869,598 A | 9/1989 | McDonald |
| 4,879,488 A | 11/1989 | Silver |
| 4,906,930 A | 3/1990 | Nakane et al. |
| 4,918,328 A | 4/1990 | Kuo |
| 4,922,250 A | 5/1990 | Phillips et al. |
| 4,926,067 A | 5/1990 | Whiteley |
| 4,947,118 A | 8/1990 | Fujimaki |
| 4,962,316 A | 10/1990 | Jack |
| 4,974,205 A | 11/1990 | Kotani |
| 4,977,402 A | 12/1990 | Ko |
| 4,982,080 A | 1/1991 | Wilson et al. |
| 4,983,971 A | 1/1991 | Przybysz et al. |
| 5,012,243 A | 4/1991 | Lee |
| 5,019,721 A | 5/1991 | Martens et al. |
| 5,019,818 A | 5/1991 | Lee |
| 5,021,658 A | 6/1991 | Bluzer |
| 5,024,993 A | 6/1991 | Kroger et al. |
| 5,039,656 A | 8/1991 | Hidaka |
| 5,051,627 A | 9/1991 | Schneier et al. |
| 5,051,787 A | 9/1991 | Hasegawa |
| 5,053,834 A | 10/1991 | Simmonds |
| 5,058,431 A | 10/1991 | Karwacki |
| 5,077,266 A | 12/1991 | Takagi et al. |
| 5,093,618 A | 3/1992 | Goto et al. |
| 5,099,152 A | 3/1992 | Suzuki |
| 5,109,164 A | 4/1992 | Matsui |
| 5,111,082 A | 5/1992 | Harada |
| 5,114,912 A | 5/1992 | Benz |
| 5,124,583 A | 6/1992 | Hatano et al. |
| 5,126,568 A | 6/1992 | Durst |
| 5,126,598 A | 6/1992 | Kotani |
| 5,140,324 A | 8/1992 | Przybysz et al. |
| 5,146,119 A | 9/1992 | Kamikawai et al. |
| 5,155,093 A | 10/1992 | Den et al. |
| 5,155,434 A | 10/1992 | Fujimaki |
| 5,162,298 A | 11/1992 | Chaudhari et al. |
| 5,162,731 A | 11/1992 | Fujimaki |
| 5,164,618 A | 11/1992 | Murphy et al. |
| 5,166,614 A | 11/1992 | Yokosawa et al. |
| 5,170,080 A | 12/1992 | Murphy et al. |
| 5,191,236 A | 3/1993 | Ruby |
| 5,192,951 A | 3/1993 | Ko |
| 5,193,909 A | 3/1993 | Duncan |
| 5,194,807 A | 3/1993 | Ueda |
| 5,198,815 A | 3/1993 | Przybysz et al. |
| 5,218,297 A | 6/1993 | Nakane et al. |
| 5,219,828 A | 6/1993 | Shintaku et al. |
| 5,229,655 A | 7/1993 | Martens et al. |
| 5,233,242 A | 8/1993 | Murphy et al. |
| 5,233,243 A | 8/1993 | Murphy et al. |
| 5,233,244 A | 8/1993 | Suzuki |
| 5,250,506 A | 10/1993 | Saitoh et al. |
| 5,253,199 A | 10/1993 | Gibson |
| 5,254,945 A | 10/1993 | Nojima et al. |
| 5,262,395 A | 11/1993 | Ginley et al. |
| 5,266,844 A | 11/1993 | Ko et al. |
| 5,272,479 A | 12/1993 | Silver |
| 5,276,639 A | 1/1994 | Inoue |
| 5,278,140 A | 1/1994 | Chaudhari et al. |
| 5,285,155 A | 2/1994 | Ueda et al. |
| 5,286,710 A | 2/1994 | Hascicek et al. |
| 5,287,057 A | 2/1994 | Gotoh |
| 5,294,884 A | 3/1994 | Goto et al. |
| 5,295,093 A | 3/1994 | Nagasawa |
| 5,309,038 A | 5/1994 | Harada et al. |
| 5,315,180 A | 5/1994 | Kotani |
| 5,318,951 A | 6/1994 | Shintaku et al. |
| 5,319,307 A | 6/1994 | Simmonds |
| 5,321,004 A | 6/1994 | Perez et al. |
| 5,323,344 A | 6/1994 | Katayama et al. |
| 5,326,986 A | 7/1994 | Miller, Jr. et al. |
| 5,327,130 A | 7/1994 | Kang et al. |
| 5,331,162 A | 7/1994 | Silver et al. |
| 5,334,884 A | 8/1994 | Tesche |
| 5,339,457 A | 8/1994 | Kawasaki et al. |
| 5,341,136 A | 8/1994 | Przybysz et al. |
| 5,343,081 A | 8/1994 | Nakamura |
| 5,345,114 A | 9/1994 | Ma et al. |
| 5,352,978 A | 10/1994 | Nojima et al. |
| 5,355,035 A | 10/1994 | Vora et al. |
| 5,355,085 A | 10/1994 | Igarashi et al. |
| 5,358,928 A | 10/1994 | Ginley et al. |
| 5,376,624 A | 12/1994 | Perez et al. |
| 5,378,999 A | 1/1995 | Martens et al. |
| 5,388,068 A | 2/1995 | Ghoshal et al. |
| 5,389,837 A | 2/1995 | Hietala et al. |
| 5,396,242 A | 3/1995 | Lee |
| 5,400,026 A | 3/1995 | Bradley |
| 5,406,133 A | 4/1995 | Vora et al. |
| 5,420,586 A | 5/1995 | Radparvar |
| 5,424,641 A | 6/1995 | Gotoh |
| 5,424,656 A | 6/1995 | Gibson et al. |
| 5,434,530 A | 7/1995 | Ghoshal et al. |
| 5,436,451 A | 7/1995 | Silver et al. |
| 5,442,195 A | 8/1995 | Saitoh et al. |
| 5,455,451 A | 10/1995 | Usagawa et al. |

(56) References Cited

U.S. PATENT DOCUMENTS

| | | |
|---|---|---|
| 5,455,519 A | 10/1995 | Ohori |
| 5,464,813 A | 11/1995 | Hascicek et al. |
| 5,472,934 A | 12/1995 | Akoh et al. |
| 5,479,131 A | 12/1995 | Lee |
| 5,488,295 A | 1/1996 | Seppa |
| 5,493,719 A | 2/1996 | Smith et al. |
| 5,532,485 A | 7/1996 | Bluzer et al. |
| 5,532,592 A | 7/1996 | Colclough |
| 5,552,735 A | 9/1996 | Kang et al. |
| 5,565,866 A | 10/1996 | Hamilton et al. |
| 5,570,059 A | 10/1996 | Vora et al. |
| 5,574,369 A | 11/1996 | Hibbs |
| 5,600,172 A | 2/1997 | McDevitt et al. |
| 5,600,242 A | 2/1997 | Hubbell |
| 5,610,510 A | 3/1997 | Boone et al. |
| 5,610,857 A | 3/1997 | Nandakumar |
| 5,625,290 A | 4/1997 | You |
| 5,629,889 A | 5/1997 | Chandra et al. |
| 5,646,526 A | 7/1997 | Takeda et al. |
| 5,656,937 A | 8/1997 | Cantor |
| 5,668,495 A | 9/1997 | Vora et al. |
| 5,682,042 A | 10/1997 | Amer et al. |
| 5,706,192 A | 1/1998 | Schwartz et al. |
| 5,764,048 A | 6/1998 | Yoshida |
| 5,767,043 A | 6/1998 | Cantor et al. |
| 5,818,373 A | 10/1998 | Semenov et al. |
| 5,831,278 A | 11/1998 | Berkowitz |
| 5,834,794 A | 11/1998 | Fuke et al. |
| 5,844,407 A | 12/1998 | Hubbell |
| 5,854,604 A | 12/1998 | Przybysz et al. |
| 5,869,846 A | 2/1999 | Higashino et al. |
| 5,872,368 A | 2/1999 | Osofsky et al. |
| 5,877,592 A | 3/1999 | Hesterman et al. |
| 5,880,647 A | 3/1999 | Kim |
| 5,912,503 A | 6/1999 | Chan et al. |
| 5,920,811 A | 7/1999 | Suzuki et al. |
| 5,930,165 A | 7/1999 | Johnson et al. |
| 5,933,001 A | 8/1999 | Hubbell |
| 5,936,458 A | 8/1999 | Rylov |
| 5,939,871 A | 8/1999 | Tanaka |
| 5,942,765 A | 8/1999 | Miyahara et al. |
| 5,942,997 A | 8/1999 | Silver et al. |
| 5,955,400 A | 9/1999 | Yokosawa et al. |
| 5,963,351 A | 10/1999 | Kaplounenko et al. |
| 5,982,219 A | 11/1999 | Kirichenko |
| 5,994,891 A | 11/1999 | Hubbell |
| 6,002,268 A | 12/1999 | Sasaki et al. |
| 6,005,380 A | 12/1999 | Hubbell |
| 6,008,642 A | 12/1999 | Bulsara et al. |
| 6,025,736 A | 2/2000 | Vora et al. |
| 6,051,440 A | 4/2000 | Chan et al. |
| 6,118,284 A | 9/2000 | Ghoshal et al. |
| 6,130,550 A | 10/2000 | Zaliznyak et al. |
| 6,157,329 A | 12/2000 | Lee et al. |
| 6,169,397 B1 | 1/2001 | Steinbach et al. |
| 6,188,236 B1 | 2/2001 | Wikborg |
| 6,236,344 B1 | 5/2001 | Benz et al. |
| 6,239,431 B1 | 5/2001 | Hilton et al. |
| 6,242,939 B1 | 6/2001 | Nagasawa et al. |
| 6,263,189 B1 | 7/2001 | Reagor |
| 6,285,186 B1 | 9/2001 | Morooka |
| 6,310,488 B1 | 10/2001 | Hasegawa et al. |
| 6,320,369 B1 | 11/2001 | Hidaka et al. |
| 6,323,645 B1 | 11/2001 | Morooka et al. |
| 6,331,805 B1 | 12/2001 | Gupta et al. |
| 6,348,699 B1 | 2/2002 | Zehe |
| 6,353,330 B1 | 3/2002 | Kanda et al. |
| 6,362,617 B1 | 3/2002 | Hubbell |
| 6,365,912 B1 | 4/2002 | Booth et al. |
| 6,414,870 B1 | 7/2002 | Johnson et al. |
| 6,420,895 B1 | 7/2002 | Herr et al. |
| 6,483,339 B1 | 11/2002 | Durand et al. |
| 6,486,694 B1 | 11/2002 | Kirichenko |
| 6,486,756 B2 | 11/2002 | Tarutani et al. |
| 6,509,853 B2 | 1/2003 | Gupta |
| 6,518,673 B2 | 2/2003 | Herr et al. |
| 6,549,059 B1 | 4/2003 | Johnson |
| 6,552,537 B2 | 4/2003 | Odawara |
| 6,573,202 B2 | 6/2003 | Ivanov et al. |
| 6,576,951 B2 | 6/2003 | Ivanov et al. |
| 6,580,102 B2 | 6/2003 | Ivanov et al. |
| 6,580,310 B2 | 6/2003 | Herr |
| 6,597,169 B2 | 7/2003 | Morooka et al. |
| 6,605,822 B1 | 8/2003 | Blais et al. |
| 6,608,518 B2 | 8/2003 | Furuta et al. |
| 6,608,581 B1 | 8/2003 | Semenov |
| 6,614,047 B2 | 9/2003 | Tzalenchuk et al. |
| 6,627,915 B1 | 9/2003 | Ustinov et al. |
| 6,642,608 B1 | 11/2003 | Hu |
| 6,653,962 B2 | 11/2003 | Gupta et al. |
| 6,670,630 B2 | 12/2003 | Blais et al. |
| 6,690,162 B1 | 2/2004 | Schopohl et al. |
| 6,724,216 B2 | 4/2004 | Suzuki et al. |
| 6,725,248 B1 | 4/2004 | Hasegawa et al. |
| 6,728,131 B2 | 4/2004 | Ustinov |
| 6,734,699 B1 | 5/2004 | Herr et al. |
| 6,744,308 B1 | 6/2004 | Beumer |
| 6,750,794 B1 | 6/2004 | Durand et al. |
| 6,756,925 B1 * | 6/2004 | Leung ............... H04L 25/4904 331/11 |
| 6,759,974 B1 | 7/2004 | Herr |
| 6,777,808 B2 | 8/2004 | Herr et al. |
| 6,784,451 B2 | 8/2004 | Amin et al. |
| 6,791,109 B2 | 9/2004 | Tzalenchuk et al. |
| 6,803,599 B2 | 10/2004 | Amin et al. |
| 6,812,484 B2 | 11/2004 | Tzalenchuk et al. |
| 6,815,708 B1 | 11/2004 | Iguchi et al. |
| 6,822,255 B2 | 11/2004 | Tzalenchuk et al. |
| 6,836,141 B2 | 12/2004 | Herr |
| 6,838,404 B2 | 1/2005 | Hentges et al. |
| 6,838,694 B2 | 1/2005 | Esteve et al. |
| 6,853,185 B2 | 2/2005 | Tsukamoto et al. |
| 6,885,325 B2 | 4/2005 | Omelyanchouk et al. |
| 6,897,468 B2 | 5/2005 | Blais et al. |
| 6,900,454 B2 | 5/2005 | Blais et al. |
| 6,900,456 B2 | 5/2005 | Blais et al. |
| 6,908,771 B2 | 6/2005 | Lee et al. |
| 6,909,109 B2 | 6/2005 | Herr |
| 6,909,886 B2 | 6/2005 | Magnusen et al. |
| 6,919,579 B2 | 7/2005 | Amin et al. |
| 6,922,066 B2 | 7/2005 | Hidaka |
| 6,922,556 B2 | 7/2005 | Beumer |
| 6,930,318 B2 | 8/2005 | Vion et al. |
| 6,930,320 B2 | 8/2005 | Blais et al. |
| 6,936,841 B2 | 8/2005 | Amin et al. |
| 6,949,970 B2 | 9/2005 | Ishizaki et al. |
| 6,960,780 B2 | 11/2005 | Blais et al. |
| 6,979,836 B2 | 12/2005 | Zagoskin et al. |
| 6,987,282 B2 | 1/2006 | Amin et al. |
| 6,993,310 B2 | 1/2006 | Magnusen et al. |
| 7,002,174 B2 | 2/2006 | Il'ichev et al. |
| 7,002,366 B2 * | 2/2006 | Eaton ............... G05F 1/46 326/3 |
| 7,075,171 B2 | 7/2006 | Hato |
| 7,095,227 B2 | 8/2006 | Tarutani et al. |
| 7,106,057 B2 | 9/2006 | Matthews et al. |
| 7,129,869 B2 | 10/2006 | Furuta et al. |
| 7,129,870 B2 | 10/2006 | Hirano et al. |
| 7,135,701 B2 | 11/2006 | Amin et al. |
| 7,227,480 B2 | 6/2007 | Furuta et al. |
| 7,230,266 B2 | 6/2007 | Hilton et al. |
| 7,242,918 B2 | 7/2007 | Magnusen et al. |
| 7,248,044 B2 | 7/2007 | Kobayashi et al. |
| 7,268,713 B2 | 9/2007 | Suzuki et al. |
| 7,300,909 B2 | 11/2007 | Hato et al. |
| 7,307,275 B2 | 12/2007 | Lidar et al. |
| 7,332,738 B2 | 2/2008 | Blais et al. |
| 7,364,923 B2 | 4/2008 | Lidar et al. |
| 7,365,663 B2 | 4/2008 | Rylov et al. |
| 7,378,865 B2 | 5/2008 | Taguchi et al. |
| 7,394,246 B2 | 7/2008 | Chieh et al. |
| 7,418,283 B2 | 8/2008 | Amin |
| 7,449,769 B2 | 11/2008 | Hato |
| 7,498,832 B2 | 3/2009 | Baumgardner et al. |

(56) References Cited

U.S. PATENT DOCUMENTS

| | | | |
|---|---|---|---|
| 7,505,310 B2 | 3/2009 | Nagasawa et al. |
| 7,508,230 B2 | 3/2009 | Kirichenko |
| 7,521,708 B1 | 4/2009 | Agassi |
| 7,532,917 B2 | 5/2009 | Humphreys et al. |
| 7,533,068 B2 | 5/2009 | Maassen van den Brink et al. |
| 7,554,369 B2 | 6/2009 | Kirichenko |
| 7,557,600 B2 | 7/2009 | Chong et al. |
| 7,570,075 B2 | 8/2009 | Gupta et al. |
| 7,613,764 B1 | 11/2009 | Hilton et al. |
| 7,613,765 B1 | 11/2009 | Hilton et al. |
| 7,619,437 B2 | 11/2009 | Thom et al. |
| 7,624,088 B2 | 11/2009 | Johnson et al. |
| 7,680,474 B2 | 3/2010 | Kirichenko et al. |
| 7,714,605 B2 | 5/2010 | Baumgardner et al. |
| 7,719,453 B2 | 5/2010 | Kim et al. |
| 7,724,020 B2 * | 5/2010 | Herr ............... B82Y 10/00 326/3 |
| 7,733,253 B2 | 6/2010 | Kirichenko |
| 7,750,664 B2 | 7/2010 | Kirichenko |
| 7,760,625 B2 | 7/2010 | Miyaho et al. |
| 7,772,871 B2 | 8/2010 | Herr et al. |
| 7,782,077 B2 | 8/2010 | Herr et al. |
| 7,786,748 B1 | 8/2010 | Herr |
| 7,786,786 B2 | 8/2010 | Kirichenko |
| 7,788,192 B2 | 8/2010 | Amin |
| 7,816,940 B1 | 10/2010 | Gupta et al. |
| 7,847,615 B2 | 12/2010 | Yorozu et al. |
| 7,852,106 B2 | 12/2010 | Herr et al. |
| 7,863,892 B2 | 1/2011 | Morley et al. |
| 7,868,645 B2 | 1/2011 | Herr et al. |
| 7,876,869 B1 | 1/2011 | Gupta |
| 7,893,708 B2 | 2/2011 | Baumgardner et al. |
| 7,912,530 B2 | 3/2011 | Seki et al. |
| 7,944,253 B1 | 5/2011 | Kirichenko |
| 7,953,174 B2 * | 5/2011 | Asbeck .............. H04B 14/06 375/295 |
| 7,969,178 B2 | 6/2011 | Przybysz et al. |
| 7,969,805 B2 | 6/2011 | Thom et al. |
| 7,977,668 B2 | 7/2011 | Nevirkovets et al. |
| 7,977,964 B2 | 7/2011 | Herr |
| 7,991,814 B2 | 8/2011 | Filippov et al. |
| 8,008,942 B2 | 8/2011 | van Den Brink et al. |
| 8,032,196 B2 | 10/2011 | Wakana et al. |
| 8,045,660 B1 | 10/2011 | Gupta |
| 8,050,648 B1 | 11/2011 | Kirichenko et al. |
| 8,055,318 B1 | 11/2011 | Kadin |
| 8,098,179 B2 | 1/2012 | Bunyk et al. |
| 8,130,880 B1 | 3/2012 | Gupta |
| 8,138,784 B2 | 3/2012 | Przybysz et al. |
| 8,155,726 B2 | 4/2012 | Seki et al. |
| 8,165,531 B2 | 4/2012 | Nikolova et al. |
| 8,179,133 B1 | 5/2012 | Kornev et al. |
| 8,188,901 B1 | 5/2012 | Inamdar et al. |
| 8,283,943 B2 | 10/2012 | Van Den Brink et al. |
| 8,284,585 B2 | 10/2012 | Maekawa et al. |
| 8,330,145 B2 | 12/2012 | Wakana et al. |
| 8,406,834 B2 | 3/2013 | Kirichenko |
| 8,437,168 B2 | 5/2013 | Maekawa et al. |
| 8,489,163 B2 | 7/2013 | Herr et al. |
| 8,504,497 B2 | 8/2013 | Amin |
| 8,508,280 B2 | 8/2013 | Naaman et al. |
| 8,514,986 B2 | 8/2013 | Gupta |
| 8,571,614 B1 | 10/2013 | Mukhanov et al. |
| 8,610,453 B2 | 12/2013 | Herr |
| 8,633,472 B2 | 1/2014 | Boulaevskii et al. |
| 8,654,578 B2 | 2/2014 | Lewis et al. |
| 8,686,751 B2 | 4/2014 | van Den Brink et al. |
| 8,698,570 B2 | 4/2014 | Afshari et al. |
| 8,781,542 B2 | 7/2014 | Tsukamoto et al. |
| 8,786,476 B2 | 7/2014 | Bunyk et al. |
| 8,861,619 B2 | 10/2014 | McDermott et al. |
| 8,872,690 B1 | 10/2014 | Inamdar et al. |
| 8,878,626 B2 | 11/2014 | Zmuidzinas et al. |
| 8,928,353 B2 | 1/2015 | Lynch et al. |
| 8,928,391 B2 | 1/2015 | Naaman et al. |
| 8,933,695 B1 | 1/2015 | Kornev et al. |
| 8,971,977 B2 | 3/2015 | Mukhanov et al. |
| 9,020,079 B2 | 4/2015 | Gupta |
| 9,030,119 B2 | 5/2015 | Jin |
| 9,069,928 B2 | 6/2015 | van Den Brink et al. |
| 9,097,751 B1 | 8/2015 | Longhini et al. |
| 9,105,793 B2 | 8/2015 | Bouchiat et al. |
| 9,174,840 B2 | 11/2015 | Herr et al. |
| 9,240,773 B1 | 1/2016 | Mukhanov et al. |
| 9,252,825 B2 | 2/2016 | Gupta |
| 9,279,863 B2 | 3/2016 | Tsukamoto et al. |
| 9,281,057 B1 | 3/2016 | Herr et al. |
| 9,292,642 B2 | 3/2016 | Herr et al. |
| 9,312,878 B1 | 4/2016 | Inamdar et al. |
| 9,344,092 B2 | 5/2016 | Abraham et al. |
| 9,355,364 B2 | 5/2016 | Miller et al. |
| 9,369,133 B2 | 6/2016 | Naaman et al. |
| 9,383,208 B2 | 7/2016 | Mohanty |
| 9,443,576 B1 | 9/2016 | Miller |
| 9,455,707 B2 | 9/2016 | Herr et al. |
| 9,466,643 B2 | 10/2016 | Herr et al. |
| 9,467,126 B1 | 10/2016 | Naaman et al. |
| 9,473,124 B1 | 10/2016 | Mukhanov et al. |
| 2001/0025012 A1 | 9/2001 | Tarutani et al. |
| 2001/0035524 A1 | 11/2001 | Zehe |
| 2002/0060635 A1 | 5/2002 | Gupta |
| 2002/0075057 A1 | 6/2002 | Tanaka et al. |
| 2002/0097047 A1 | 7/2002 | Odawara |
| 2002/0117656 A1 | 8/2002 | Amin et al. |
| 2002/0117738 A1 | 8/2002 | Amin et al. |
| 2002/0121636 A1 | 9/2002 | Amin et al. |
| 2002/0128156 A1 | 9/2002 | Morooka et al. |
| 2002/0169079 A1 | 11/2002 | Suzuki et al. |
| 2002/0177529 A1 | 11/2002 | Ustinov |
| 2002/0179937 A1 | 12/2002 | Ivanov et al. |
| 2002/0179939 A1 | 12/2002 | Ivanov et al. |
| 2002/0188578 A1 | 12/2002 | Amin et al. |
| 2002/0190381 A1 | 12/2002 | Herr et al. |
| 2003/0016069 A1 | 1/2003 | Furuta et al. |
| 2003/0028338 A1 | 2/2003 | Hidaka |
| 2003/0039138 A1 | 2/2003 | Herr |
| 2003/0057441 A1 | 3/2003 | Ivanov et al. |
| 2003/0058026 A1 | 3/2003 | Johnson |
| 2003/0068832 A1 | 4/2003 | Koval et al. |
| 2003/0071258 A1 | 4/2003 | Zagoskin et al. |
| 2003/0076251 A1 | 4/2003 | Gupta et al. |
| 2003/0111659 A1 | 6/2003 | Tzalenchuk et al. |
| 2003/0111661 A1 | 6/2003 | Tzalenchuk et al. |
| 2003/0121028 A1 | 6/2003 | Coury et al. |
| 2003/0130127 A1 | 7/2003 | Hentges et al. |
| 2003/0146429 A1 | 8/2003 | Tzalenchuk et al. |
| 2003/0146430 A1 | 8/2003 | Tzalenchuk et al. |
| 2003/0169041 A1 | 9/2003 | Coury et al. |
| 2003/0173498 A1 | 9/2003 | Blais et al. |
| 2003/0173997 A1 | 9/2003 | Blais et al. |
| 2003/0183935 A1 | 10/2003 | Herr et al. |
| 2003/0207766 A1 | 11/2003 | Esteve et al. |
| 2003/0224944 A1 | 12/2003 | Il'ichev et al. |
| 2004/0000666 A1 | 1/2004 | Lidar et al. |
| 2004/0012407 A1 | 1/2004 | Amin et al. |
| 2004/0016918 A1 | 1/2004 | Amin et al. |
| 2004/0043740 A1 | 3/2004 | Magnusen et al. |
| 2004/0043742 A1 | 3/2004 | Beumer |
| 2004/0077503 A1 | 4/2004 | Blais et al. |
| 2004/0095803 A1 | 5/2004 | Ustinov |
| 2004/0098443 A1 | 5/2004 | Omelyanchouk et al. |
| 2004/0130311 A1 | 7/2004 | Humphreys et al. |
| 2004/0135139 A1 | 7/2004 | Koval et al. |
| 2004/0149983 A1 | 8/2004 | Lee et al. |
| 2004/0150462 A1 | 8/2004 | Ishizaki et al. |
| 2004/0167036 A1 | 8/2004 | Amin et al. |
| 2004/0170047 A1 | 9/2004 | Amin et al. |
| 2004/0173787 A1 | 9/2004 | Blais et al. |
| 2004/0173792 A1 | 9/2004 | Blais et al. |
| 2004/0173793 A1 | 9/2004 | Blais et al. |
| 2004/0201400 A1 | 10/2004 | Herr |
| 2004/0223380 A1 | 11/2004 | Hato |
| 2004/0232912 A1 | 11/2004 | Tsukamoto et al. |
| 2004/0238813 A1 | 12/2004 | Lidar et al. |

(56) References Cited

U.S. PATENT DOCUMENTS

| | | |
|---|---|---|
| 2005/0001209 A1 | 1/2005 | Hilton et al. |
| 2005/0023518 A1 | 2/2005 | Herr |
| 2005/0029512 A1 | 2/2005 | Hato et al. |
| 2005/0040843 A1 | 2/2005 | Eaton et al. |
| 2005/0047245 A1 | 3/2005 | Furuta et al. |
| 2005/0078022 A1 | 4/2005 | Hirano et al. |
| 2005/0098773 A1 | 5/2005 | Vion et al. |
| 2005/0101489 A1 | 5/2005 | Blais et al. |
| 2005/0106313 A1 | 5/2005 | Lee et al. |
| 2005/0149002 A1 | 7/2005 | Wang et al. |
| 2005/0149169 A1 | 7/2005 | Wang et al. |
| 2005/0162302 A1 | 7/2005 | Omelyanchouk et al. |
| 2005/0206376 A1 | 9/2005 | Matthews et al. |
| 2005/0208920 A1 | 9/2005 | Magnusen et al. |
| 2005/0224784 A1 | 10/2005 | Amin et al. |
| 2005/0231196 A1 | 10/2005 | Tarutani et al. |
| 2005/0250651 A1 | 11/2005 | Amin et al. |
| 2005/0256007 A1 | 11/2005 | Amin et al. |
| 2006/0049891 A1 | 3/2006 | Crete |
| 2006/0128341 A1 | 6/2006 | Magnusen et al. |
| 2006/0147154 A1 | 7/2006 | Thom et al. |
| 2006/0225165 A1 | 10/2006 | Maassen van den Brink et al. |
| 2006/0255987 A1 | 11/2006 | Nagasawa et al. |
| 2006/0290553 A1 | 12/2006 | Furuta et al. |
| 2007/0049097 A1 | 3/2007 | Hirano et al. |
| 2007/0052441 A1 | 3/2007 | Taguchi et al. |
| 2007/0069339 A1 | 3/2007 | Hato |
| 2007/0075729 A1 | 4/2007 | Kirichenko |
| 2007/0075752 A1 | 4/2007 | Kirichenko |
| 2007/0077906 A1 | 4/2007 | Kirichenko et al. |
| 2007/0085534 A1 | 4/2007 | Seki et al. |
| 2007/0114994 A1 | 5/2007 | Kobayashi et al. |
| 2007/0132481 A1 | 6/2007 | Chong et al. |
| 2007/0158791 A1 | 7/2007 | Wakana et al. |
| 2007/0174227 A1 | 7/2007 | Johnson et al. |
| 2007/0180586 A1 | 8/2007 | Amin |
| 2007/0194225 A1 | 8/2007 | Zorn |
| 2007/0241747 A1 | 10/2007 | Morley et al. |
| 2008/0048902 A1 | 2/2008 | Rylov et al. |
| 2008/0051292 A1 | 2/2008 | Wakana et al. |
| 2008/0084898 A1 | 4/2008 | Miyaho et al. |
| 2008/0086438 A1 | 4/2008 | Amin et al. |
| 2008/0122434 A1 | 5/2008 | Chieh et al. |
| 2008/0146449 A1 | 6/2008 | Lesueur et al. |
| 2008/0186064 A1 | 8/2008 | Kirichenko |
| 2008/0231353 A1 | 9/2008 | Filippov et al. |
| 2009/0002014 A1 | 1/2009 | Gupta et al. |
| 2009/0033369 A1 | 2/2009 | Baumgardner et al. |
| 2009/0034657 A1 | 2/2009 | Nikolova et al. |
| 2009/0057652 A1 | 3/2009 | Nevirkovets et al. |
| 2009/0073017 A1 | 3/2009 | Kim et al. |
| 2009/0082209 A1 | 3/2009 | Bunyk et al. |
| 2009/0143665 A1 | 6/2009 | Seki et al. |
| 2009/0153180 A1 | 6/2009 | Herr |
| 2009/0167342 A1 | 7/2009 | van den Brink et al. |
| 2009/0206871 A1 | 8/2009 | Baumgardner et al. |
| 2009/0237106 A1 | 9/2009 | Kirichenko |
| 2009/0261319 A1 | 10/2009 | Maekawa et al. |
| 2009/0267635 A1 | 10/2009 | Herr et al. |
| 2009/0322374 A1 | 12/2009 | Przybysz et al. |
| 2010/0006825 A1 | 1/2010 | Wakana et al. |
| 2010/0033206 A1 | 2/2010 | Herr et al. |
| 2010/0066576 A1 | 3/2010 | Kirichenko |
| 2010/0085827 A1 | 4/2010 | Thom et al. |
| 2010/0097056 A1 | 4/2010 | Lam et al. |
| 2010/0148841 A1 | 6/2010 | Kirichenko |
| 2010/0164536 A1 | 7/2010 | Herr |
| 2010/0182039 A1 | 7/2010 | Baumgardner et al. |
| 2010/0194466 A1 | 8/2010 | Yorozu et al. |
| 2010/0207657 A1 | 8/2010 | Herr et al. |
| 2010/0237899 A1 | 9/2010 | Herr et al. |
| 2010/0306142 A1 | 12/2010 | Amin |
| 2011/0062423 A1 | 3/2011 | Boulaevskii et al. |
| 2011/0133770 A1 | 6/2011 | Przybysz et al. |
| 2011/0241765 A1 | 10/2011 | Pesetski et al. |
| 2011/0254583 A1 | 10/2011 | Herr |
| 2011/0288823 A1 | 11/2011 | Gupta |
| 2011/0298489 A1 | 12/2011 | van Den Brink et al. |
| 2012/0012818 A1 | 1/2012 | Wakana et al. |
| 2012/0094838 A1 | 4/2012 | Bunyk et al. |
| 2012/0098594 A1 | 4/2012 | Zmuidzinas et al. |
| 2012/0157319 A1 | 6/2012 | Tsukamoto et al. |
| 2012/0157321 A1 | 6/2012 | Kirichenko |
| 2012/0184445 A1 | 7/2012 | Mukhanov et al. |
| 2012/0302446 A1 | 11/2012 | Ryazanov et al. |
| 2012/0320668 A1 | 12/2012 | Lewis et al. |
| 2012/0326130 A1 | 12/2012 | Maekawa et al. |
| 2013/0007087 A1 | 1/2013 | van den Brink et al. |
| 2013/0009677 A1 | 1/2013 | Naaman et al. |
| 2013/0015885 A1 | 1/2013 | Naaman et al. |
| 2013/0040818 A1 | 2/2013 | Herr et al. |
| 2013/0043945 A1 | 2/2013 | McDermott et al. |
| 2013/0093458 A1 | 4/2013 | Lynch et al. |
| 2013/0096825 A1 | 4/2013 | Mohanty |
| 2013/0207725 A1 | 8/2013 | Afshari et al. |
| 2014/0113828 A1 | 4/2014 | Gilbert et al. |
| 2014/0175380 A1 | 6/2014 | Suzuki et al. |
| 2014/0229705 A1 | 8/2014 | van den Brink et al. |
| 2014/0249033 A1 | 9/2014 | Orozco et al. |
| 2014/0253111 A1 | 9/2014 | Orozco et al. |
| 2014/0286465 A1 | 9/2014 | Gupta |
| 2014/0292428 A1 | 10/2014 | Koyama et al. |
| 2015/0032994 A1 | 1/2015 | Chudak et al. |
| 2015/0092465 A1 | 4/2015 | Herr et al. |
| 2015/0119253 A1 | 4/2015 | Yohannes et al. |
| 2015/0123741 A1 | 5/2015 | Koyama |
| 2015/0178432 A1 | 6/2015 | Muller et al. |
| 2015/0219730 A1 | 8/2015 | Tsukamoto et al. |
| 2015/0229343 A1 | 8/2015 | Gupta |
| 2015/0254571 A1 | 9/2015 | Miller et al. |
| 2015/0332164 A1 | 11/2015 | Maassen van den Brink et al. |
| 2015/0349780 A1 | 12/2015 | Naaman et al. |
| 2016/0012882 A1 | 1/2016 | Bleloch |
| 2016/0013791 A1 | 1/2016 | Herr et al. |
| 2016/0028402 A1 | 1/2016 | McCaughan et al. |
| 2016/0028403 A1 | 1/2016 | McCaughan et al. |
| 2016/0034609 A1 | 2/2016 | Herr et al. |
| 2016/0071021 A1 | 3/2016 | Raymond |
| 2016/0071903 A1 | 3/2016 | Herr et al. |
| 2016/0079968 A1 | 3/2016 | Strand et al. |
| 2016/0087599 A1 | 3/2016 | Naaman et al. |
| 2016/0112031 A1 | 4/2016 | Abraham et al. |
| 2016/0154068 A1 | 6/2016 | Barakat et al. |
| 2016/0156357 A1 | 6/2016 | Miller et al. |
| 2016/0164505 A1 | 6/2016 | Naaman et al. |
| 2016/0169746 A1 | 6/2016 | Koyama et al. |
| 2016/0197628 A1 | 7/2016 | Gupta |
| 2016/0221825 A1 | 8/2016 | Allen et al. |
| 2016/0233860 A1 | 8/2016 | Naaman |
| 2016/0267032 A1 | 9/2016 | Rigetti et al. |
| 2016/0267964 A1 | 9/2016 | Herr et al. |
| 2016/0292586 A1 | 10/2016 | Rigetti et al. |
| 2016/0292587 A1 | 10/2016 | Rigetti et al. |

\* cited by examiner

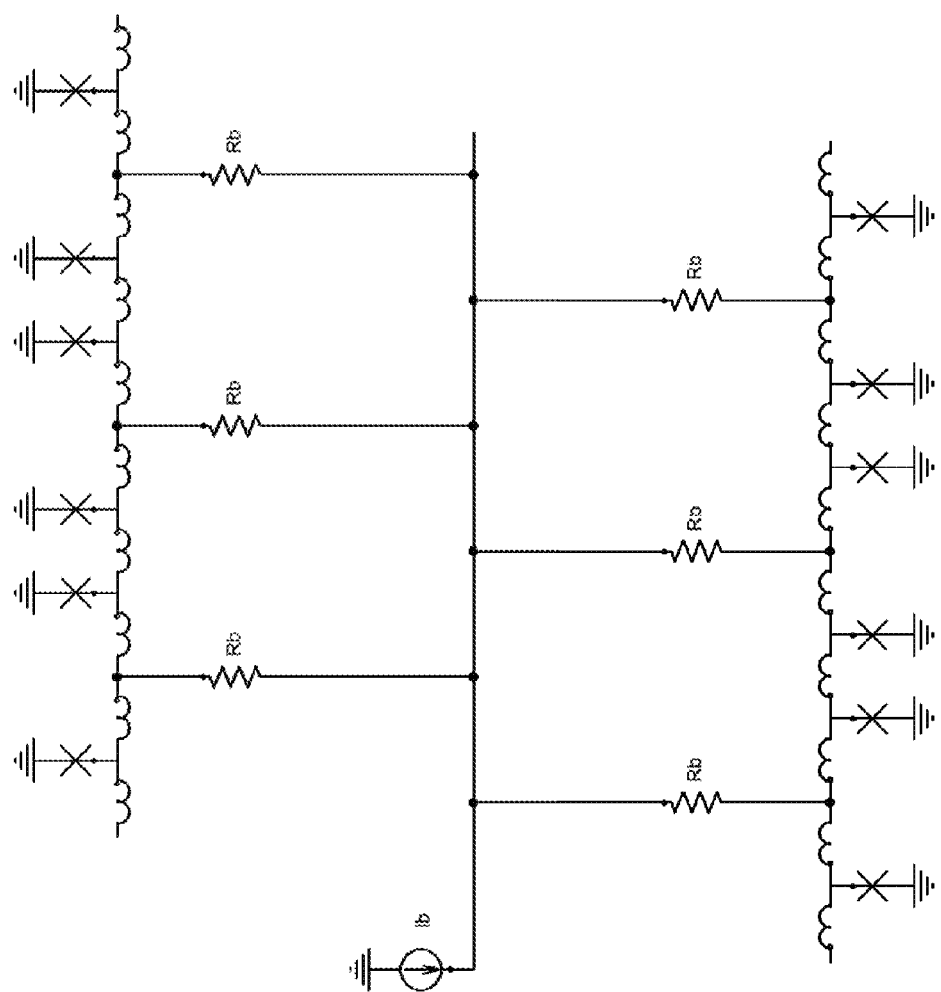
Prior Art
Fig. 1

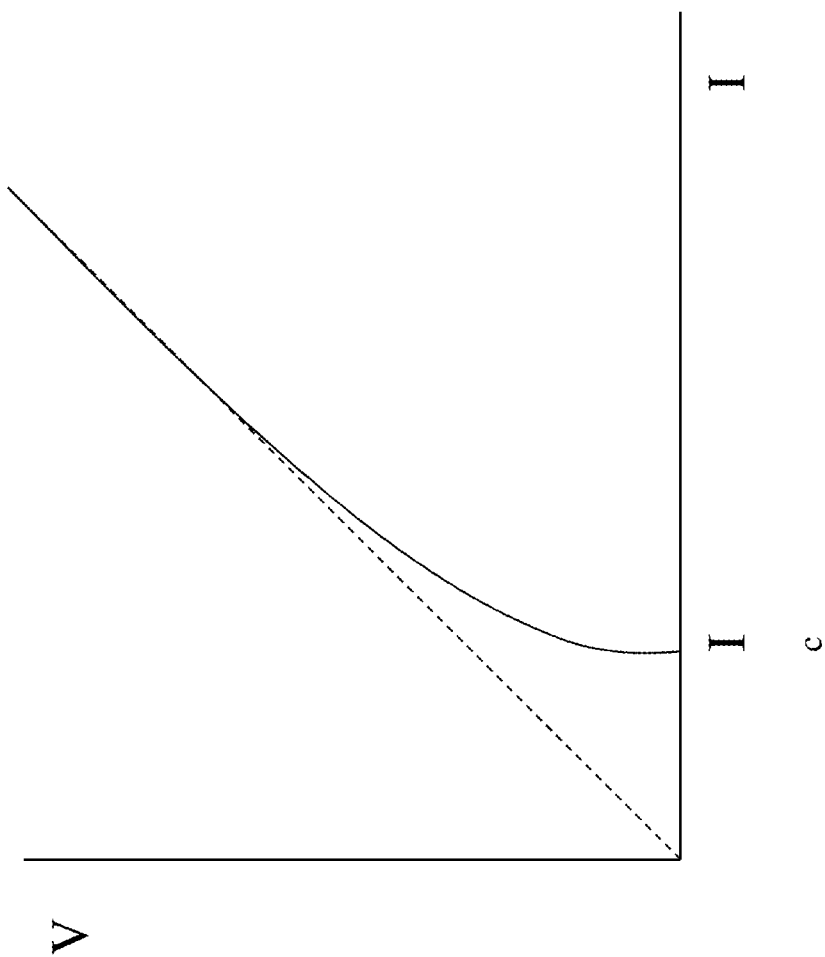

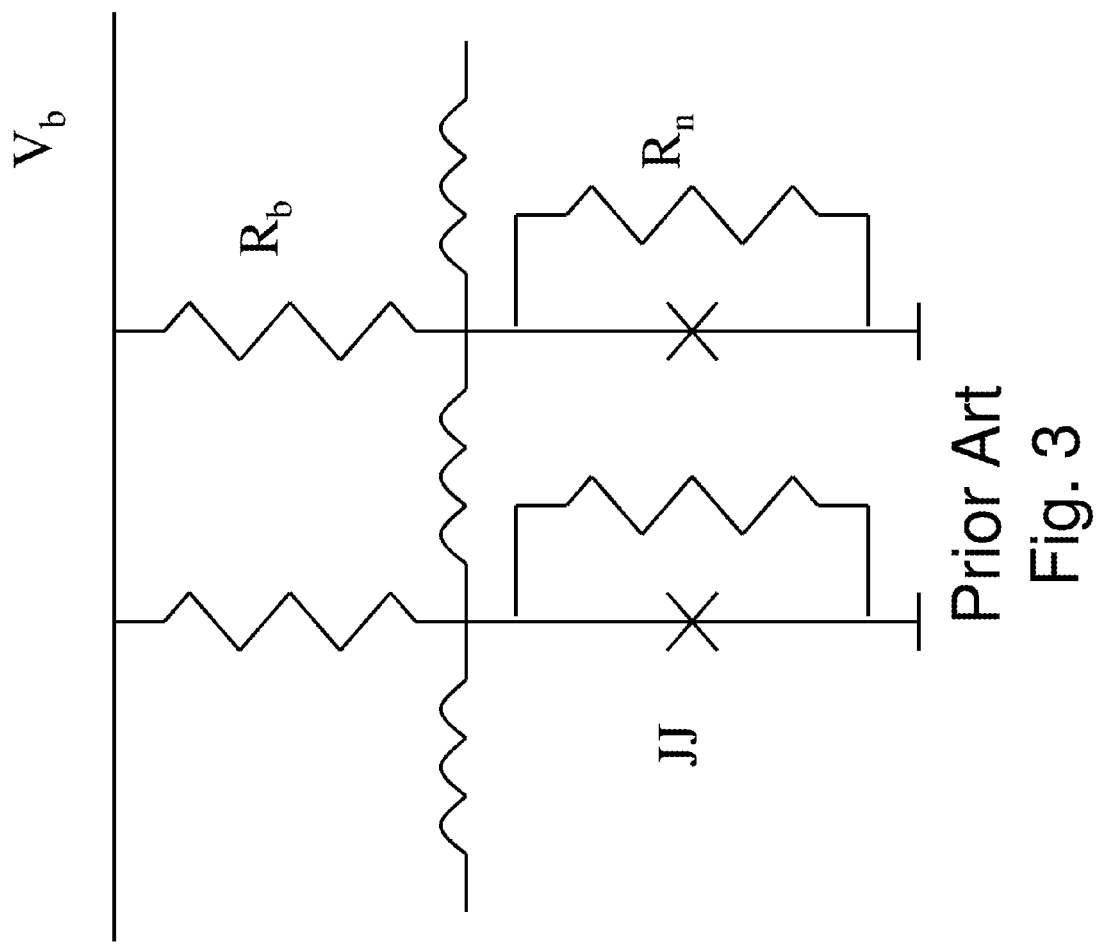
Prior Art
Fig. 3

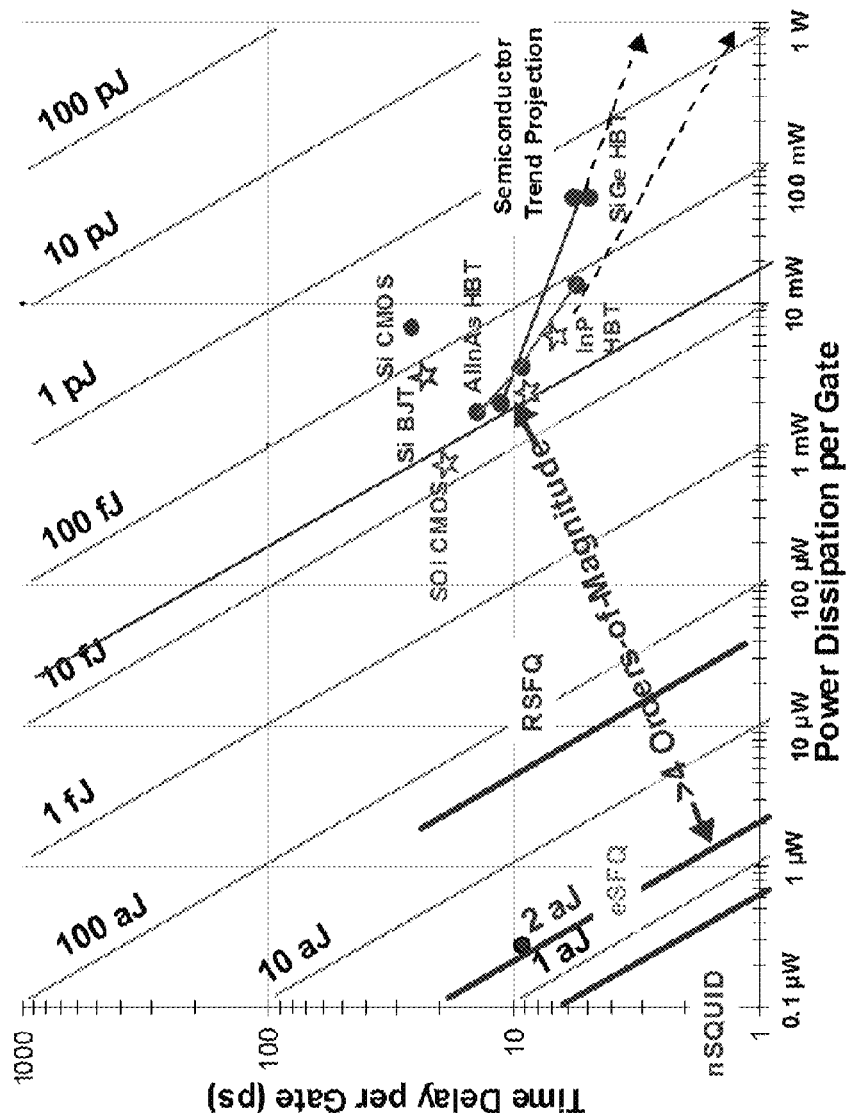
Prior Art
Fig. 4

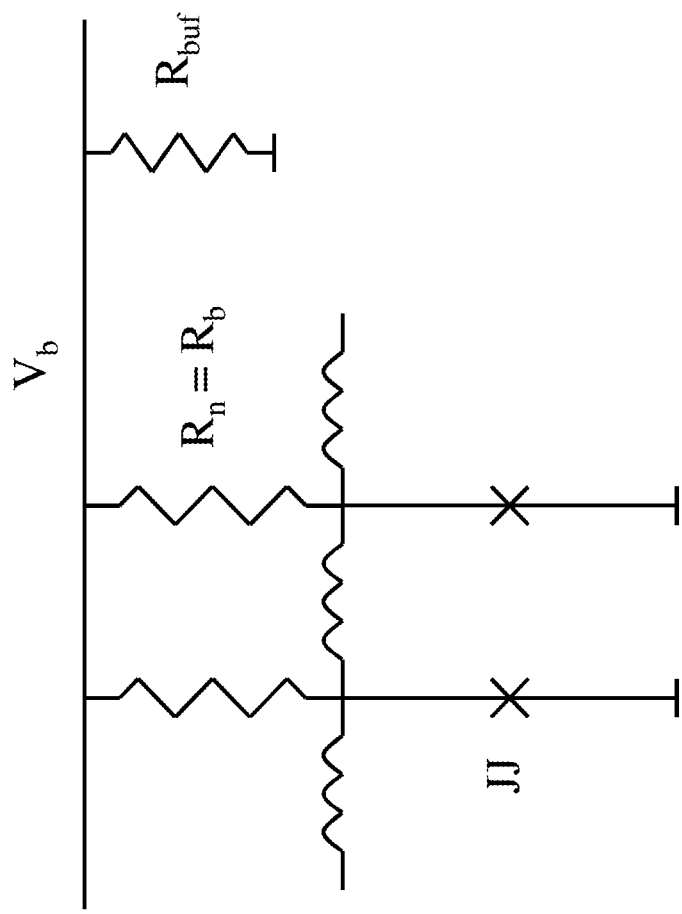
Fig. 5

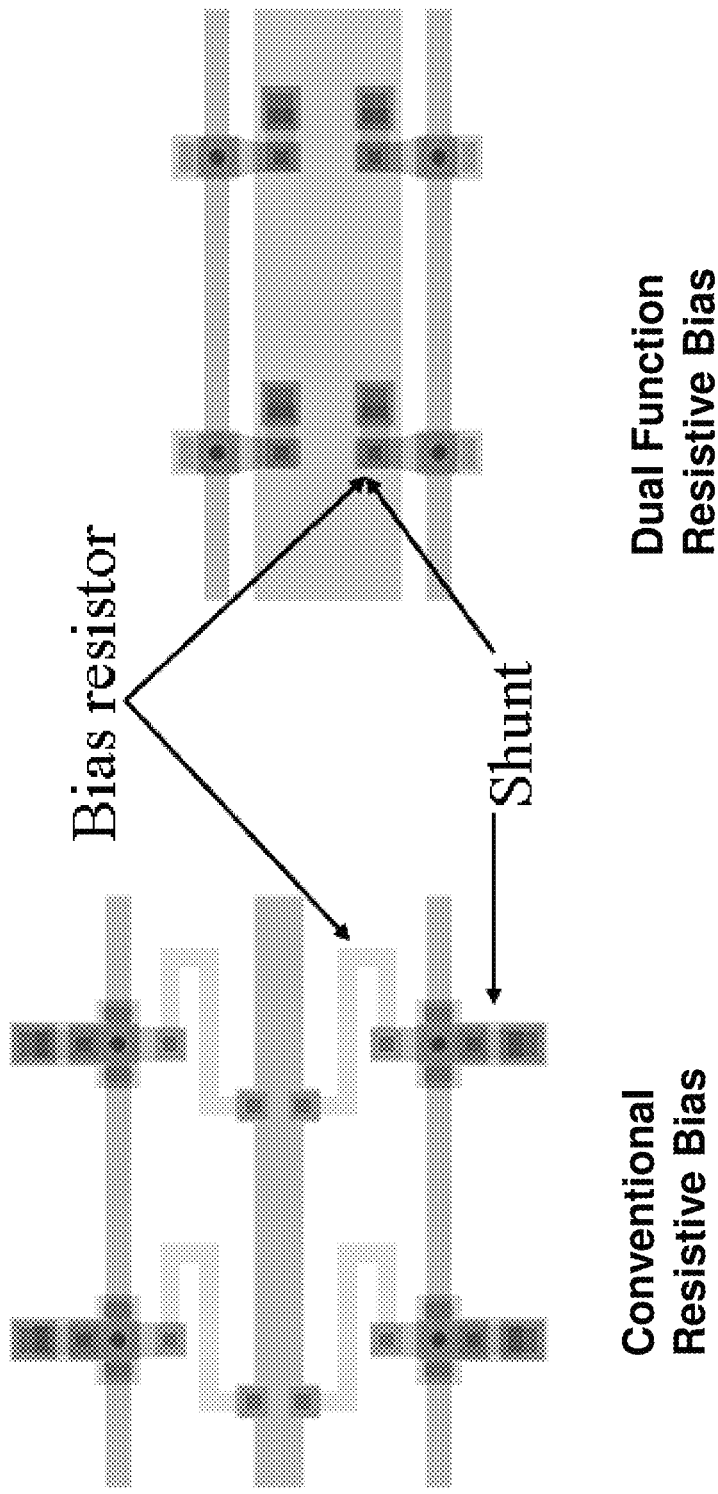
Conventional Resistive Bias
Prior Art
Fig. 6A
Dual Function Resistive Bias
Fig. 6B

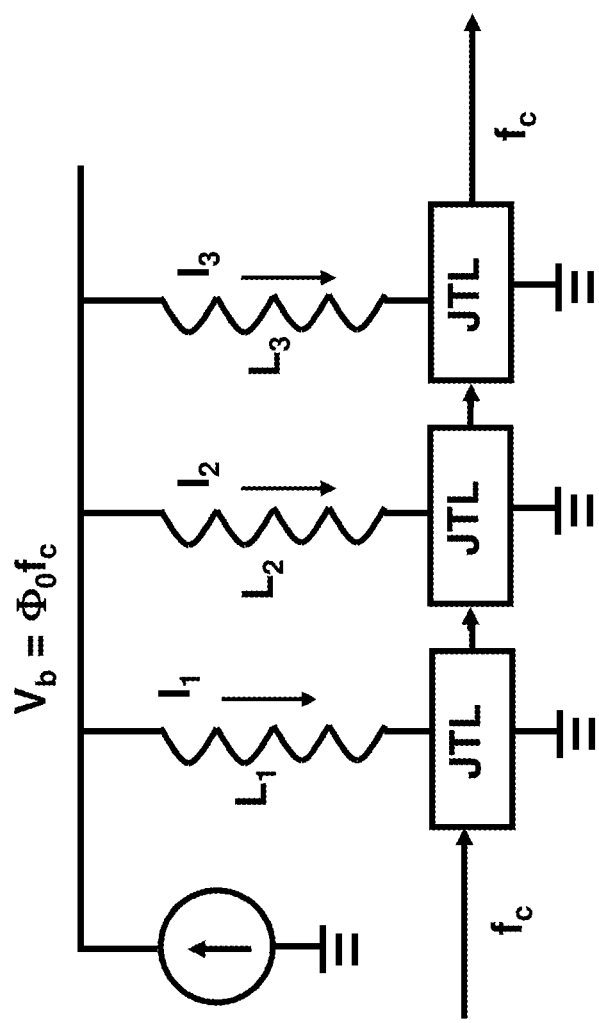
Fig. 7

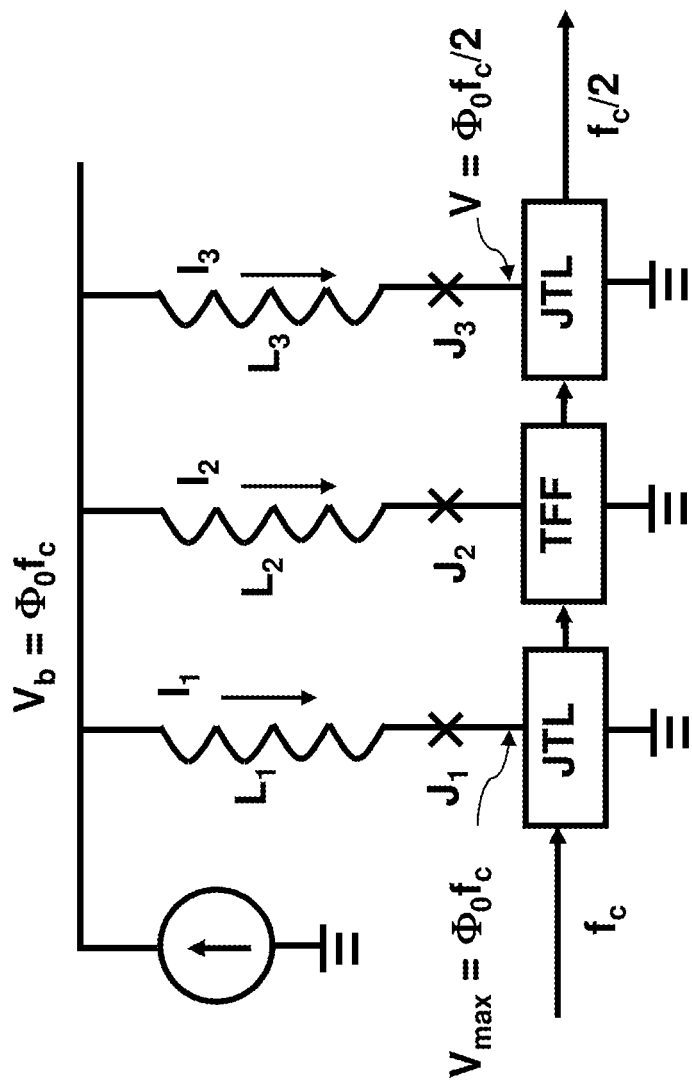
Fig. 8

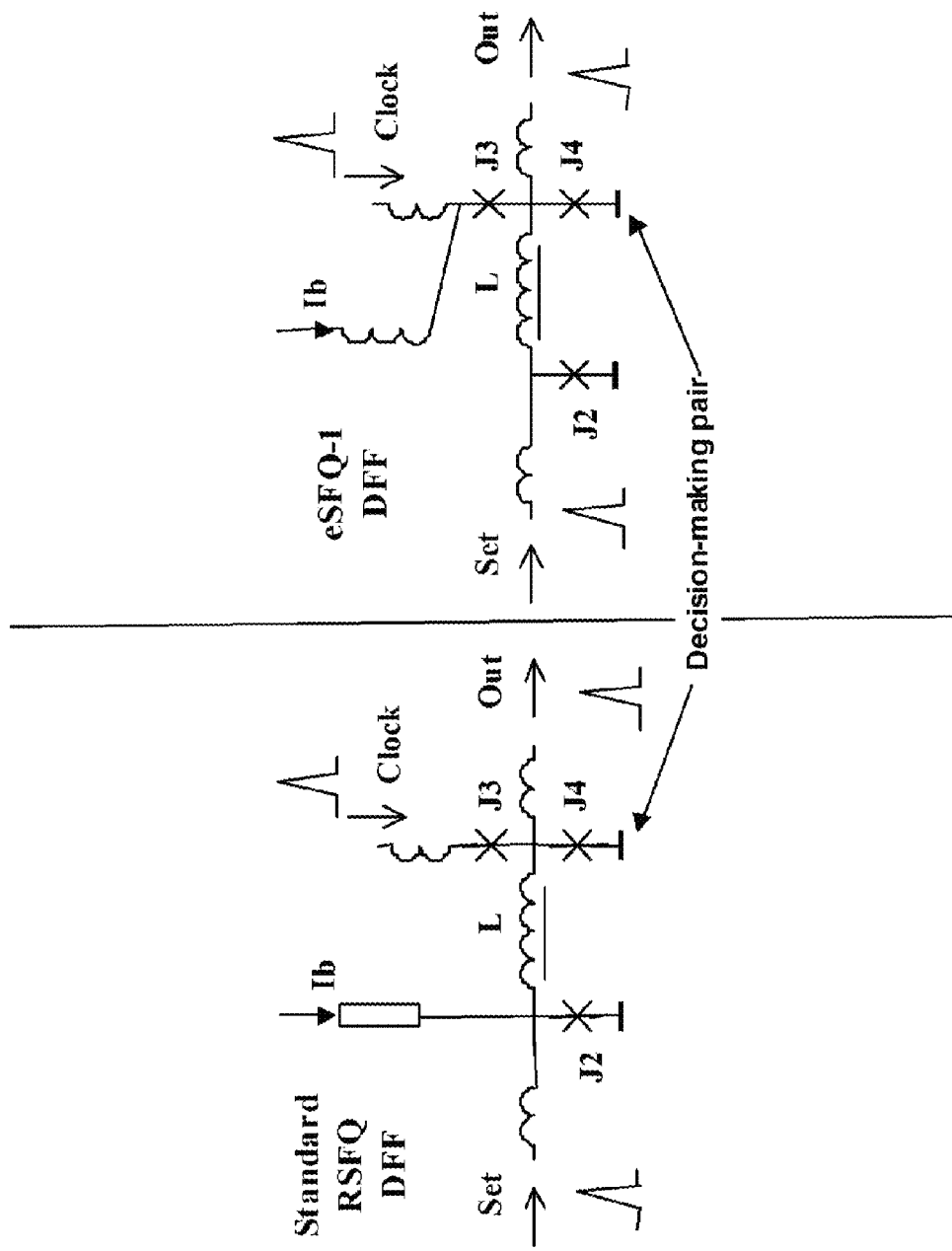
Fig. 9A

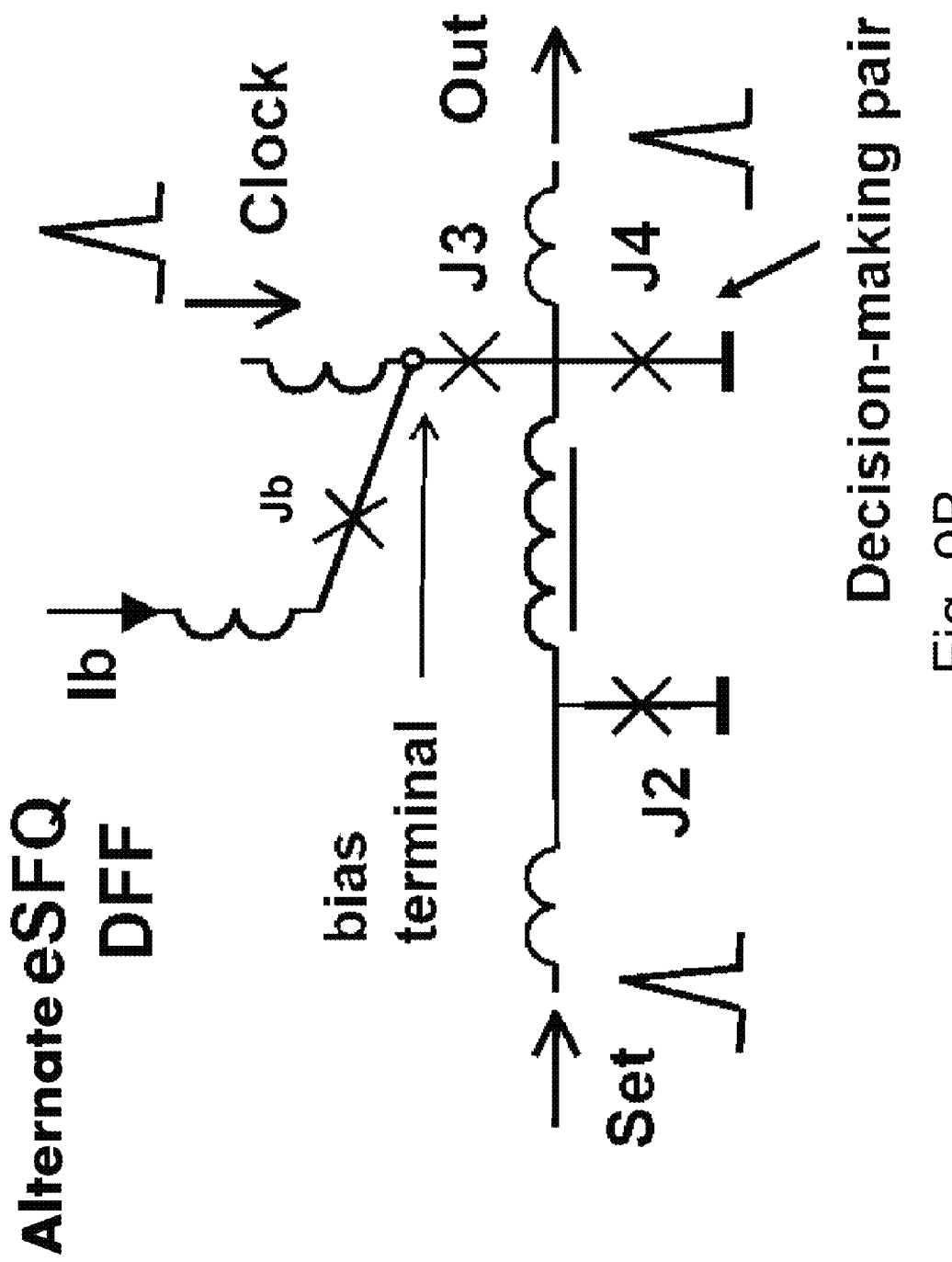
Fig. 9B

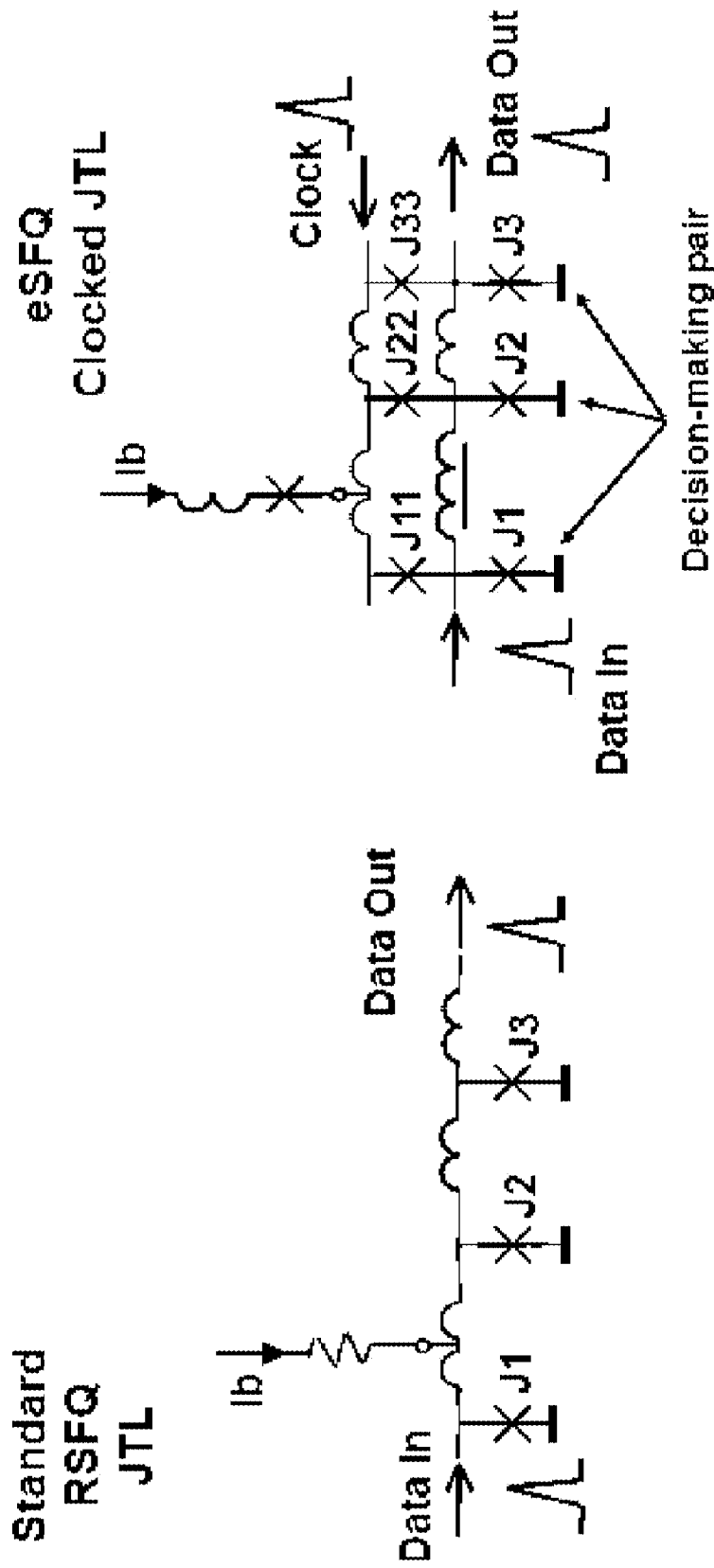
Fig. 9D
Prior Art
Fig. 9C

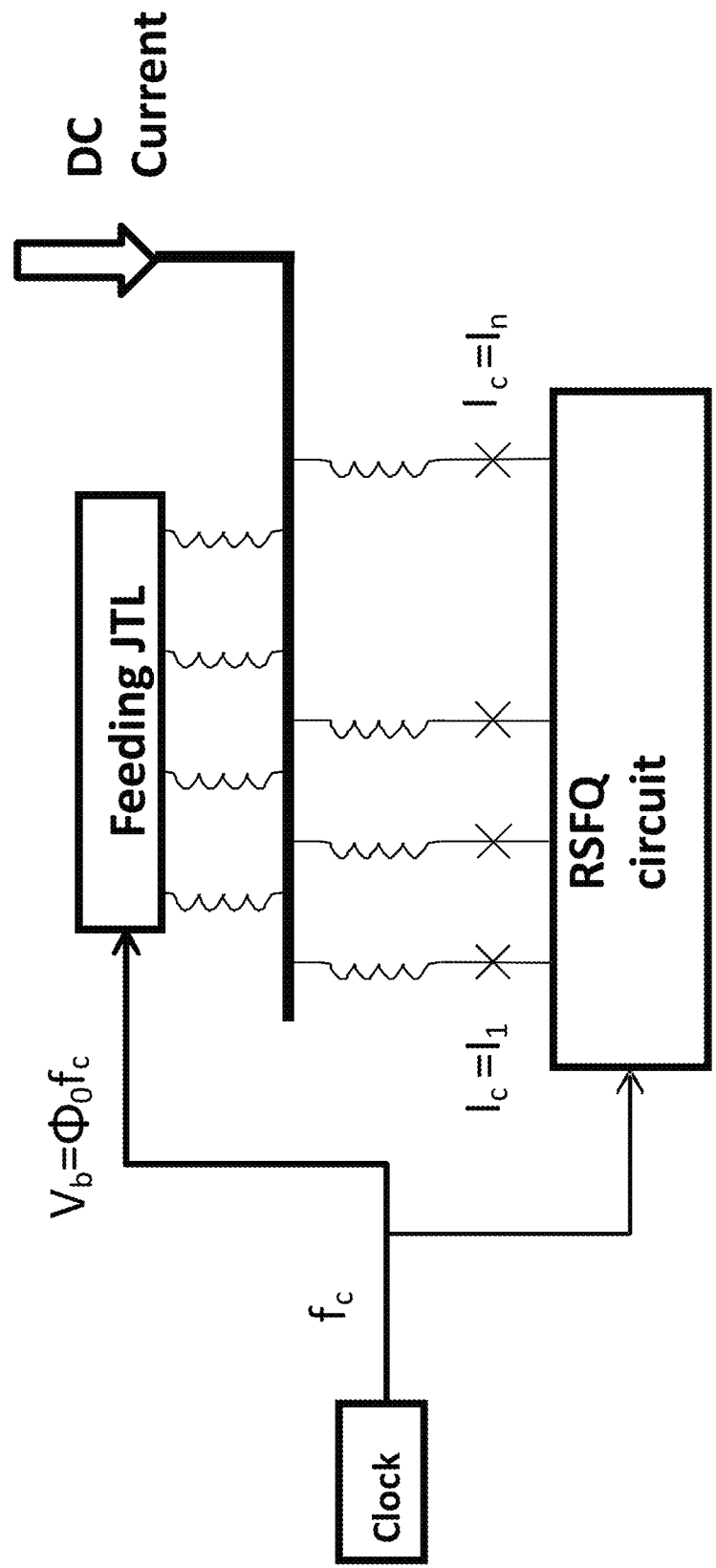
Fig. 10

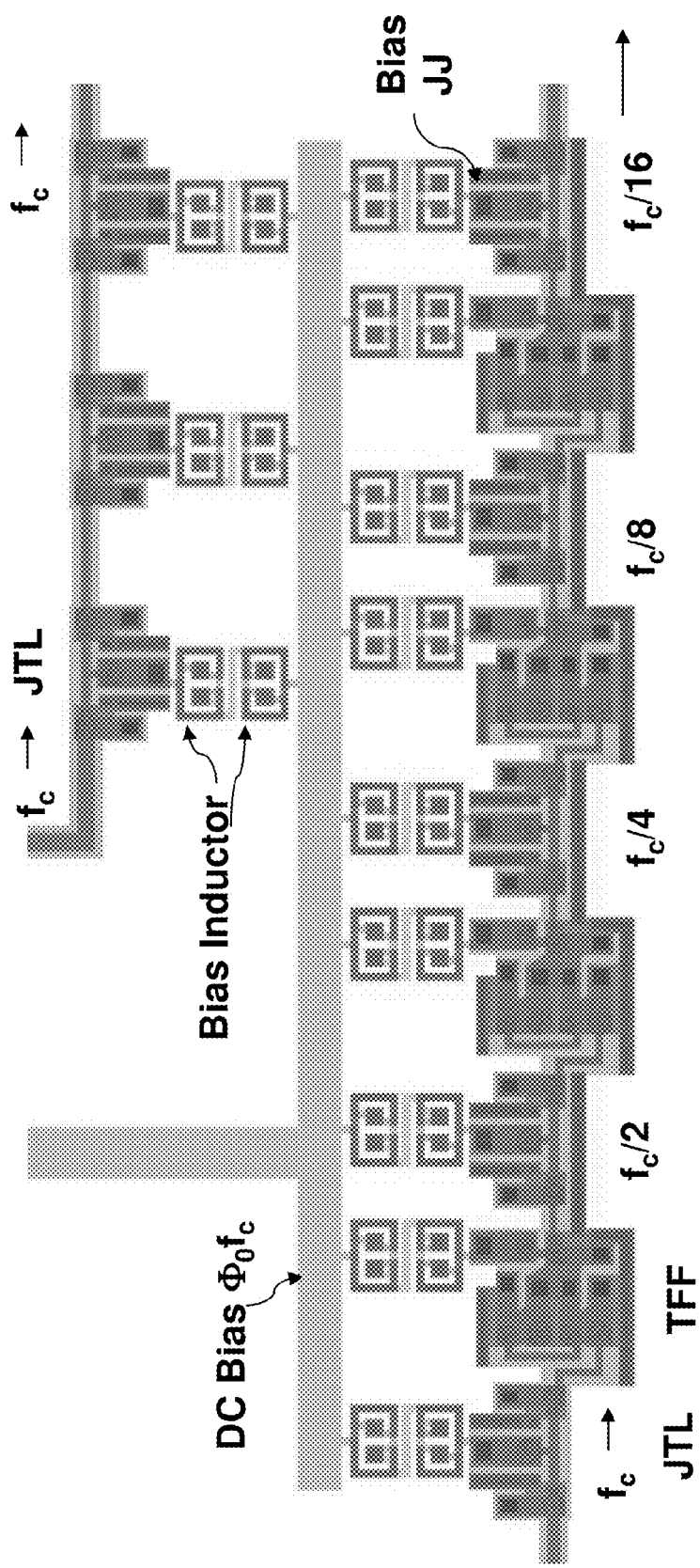
Fig. 11

LOW-POWER BIASING NETWORKS FOR SUPERCONDUCTING INTEGRATED CIRCUITS

CROSS REFERENCE TO RELATED APPLICATIONS

The present application is a Continuation of U.S. patent application Ser. No. 14/996,926, filed Jan. 15, 2016, now U.S. Pat. No. 9,473,124, issued Oct. 18, 2016, which is a Continuation of U.S. patent application Ser. No. 14/063,267, filed Oct. 28, 2013, now U.S. Pat. No. 9,240,773, issued Jan. 19, 2016, which is a Continuation of U.S. patent application Ser. No. 12/902,572, filed Oct. 12, 2010, now U.S. Pat. No. 8,571,614, issued Oct. 29, 2013, which claims benefit of priority from U.S. Provisional Patent Application No. 61/250,838, filed Oct. 12, 2009, and from U.S. Provisional Patent Application No. 61/369,927, filed Aug. 2, 2010, the entirety of which are each expressly incorporated herein by reference.

FIELD OF THE INVENTION

The present invention relates to superconducting integrated circuits. In particular, it relates to biasing schemes for superconducting circuit elements.

BACKGROUND OF THE INVENTION

Active devices in integrated circuits require one or more power supplies. For many logic families, Direct Current (DC) power sources are required. Instead of supplying all possible values of voltage and current used in the circuit, a standard approach is to use networks of resistors to distribute the power among the various bias nodes of the circuit with appropriate values. This is the case, for example, in typical superconducting circuits comprising Josephson junctions designed according to rapid-single-flux-quantum (RSFQ) logic, as shown in FIG. 1 of the prior art. Conventional RSFQ logic is reviewed in "RSFQ Logic/Memory Family", K. K. Likharev and V. K. Semenov, IEEE Transactions on Applied Superconductivity, vol. 1, pp. 3-28, March 1991, incorporated herein by reference. Each 'X' in FIG. 1 represents a damped Josephson junction with a DC I-V curve as shown in FIG. 2. The parallel array of Josephson junctions represents a simple RSFQ circuit, the Josephson transmission line (JTL). Each Josephson junction is typically biased with a dc current below its critical current $I_C$, so that it exhibits V=0 and dissipates no power in its static state. For currents just above $I_C$, the junction generates a sequence of voltage pulses, with each voltage pulse having an identical time integral $$\int V dt = \Phi_0 = h/2e = 2.07 \text{ mv-ps},$$

which is known as the single flux quantum or SFQ. For typical parameters, the pulse height is about 1 mV and the pulse width about 2 ps. Operation of an RSFQ circuit corresponds to distribution and switching of individual SFQ pulses. A typical pulse data rate may be f=40 GHz, corresponding to a time-averaged voltage of $\Phi_0 f=80$ μV. In contrast, the DC bias voltage applied to the bias resistors may be 5 mV, a factor of 60 larger. So, the overwhelming majority of the power dissipation in the circuit occurs in the static power distribution resistors.

Superconductor single flux quantum technology is based on manipulation of magnetic flux quanta $\Phi_0 = h/2e$ with energy of $\sim 2 \times 10^{-19}$ Joule or $5 \times 10^3$ $k_B T \ln(2)$ at T=4K or $k_B T \ln(2)$ at T=300K. Low power, high speed, and high sensitivity of superconductor Rapid Single Flux Quantum (RSFQ) technology (see, K. Likharev and V. Semenov, "RSFQ logic/memory family: A new Josephson-junction technology for sub-terahertz clock-frequency digital systems", IEEE Trans. Appl. Supercond., vol. 1, pp. 3-28, March 1991) have already attracted much attention for digital and mixed signal applications.

The problem of static power dissipation in RSFQ logic was discussed since its invention in 1987. It was widely perceived at the time, that solving this problem is not very urgent while demonstrating small-scale devices, and with time, when its topicality should arise, surely will be solved. Since then, a number of attempts to negate the power dissipation in bias resistors of RSFQ circuits has been undertaken. See, A. Rylyakov, "New design of single-bit all-digital RSFQ autocorrelator", IEEE Trans. Appl. Supercond., vol. 7, pp. 2709-2712, June 1997; A. Rylyakov and K. Likharev, "Pulse jitter and timing errors in RSFQ circuits", IEEE Trans. Appl. Supercond., vol. 9, pp. 3539-3444, June 1999; S. Polonsky, "Delay insensitive RSFQ circuits with zero static power dissipation," IEEE Trans. Appl. Supercond., vol. 9, pp. 3535-3538, June 1999.

The first and the most practical idea was reducing value of a bias resistor by serially connecting it with large superconducting inductance. A moderate-size circuit has been designed using this approach and successfully tested at low speed. Unfortunately, RSFQ circuits, biased with such a scheme, can only operate at frequencies much smaller than $V_{bias}/\Phi_0$. So, reducing bias resistors simultaneously reduces the maximum clock frequency. Besides, this approach reduces somewhat but does not eliminate static power dissipation.

A more radical approach was developing alternatives to RSFQ logic, e.g. S. Polonsky, "Delay insensitive RSFQ circuits with zero static power dissipation," IEEE Trans. Appl. Supercond., vol. 9, pp. 3535-3538, June 1999; and A. H. Silver, Q. P. Herr, "A new concept for ultra-low power and ultra-high clock rate circuits," IEEE Trans. Appl. Supercond., vol. 11, pp. 333-336, June 2001. None of these ideas was practical and beneficial enough to become accepted. The recently suggested RQL logic (Q. P. Herr, "Single Flux Quantum Circuits," U.S. Pat. No. 7,724,020, May 25, 2010) looks very attractive in terms of power dissipation, but requires multi-phase ac power, which makes the implementation of high-speed VLSI circuits very difficult.

Meanwhile, with the maturity of RSFQ technology, the elimination of static and reducing total power dissipation has become a very important problem in the field of superconductor microelectronics. In the emerging fields of digital readout for cryogenic detector arrays and qubit control circuitry for quantum computing, static power dissipation of standard RSFQ circuits is considered too large for the required readout and control circuits.

Another aspect of the prior art is that a damped Josephson junction generally comprises a superconducting tunnel junction in parallel with a shunt resistor, where the resistor is deliberately added to increase the device damping (see FIG. 3). An underdamped junction will tend to oscillate rather than generating SFQs, and have a hysteretic I-V curve unlike that in FIG. 2; such underdamped junctions are typically avoided in RSFQ circuits. The value of the shunt resistor is selected to obtain critical damping of the junction. The value of the bias resistor for supplying current to a Josephson junction is typically a factor of ten larger than the shunt resistor, in order to provide sufficient control and isolation of the currents in the various bias lines.

This resistive bias tree functions well to provide circuits that operate at clock frequencies up to 40 GHz and above, with maximum stability. However, the same resistor network substantially reduces one of the key advantages of RSFQ circuits, the extremely low power dissipation. The overwhelming majority of the power dissipation is associated not with the logic circuits, but rather with Joule heating in the power distribution resistors. For the typical parameters given above, only about $\frac{1}{60}^{th}$ or less than 2% of the power is intrinsic to the dynamic active devices; the rest is static heating in the bias resistors.

Even with heating in the bias resistors, RSFQ is a low-power technology. Nevertheless, it is important to keep power dissipation low for several reasons. First, as the device scale decreases and the packing density increases, the power density will increase substantially, causing local heating of the devices. Second, the total power is also increasing with circuit complexity. This would allow one to realize a significant (~orders of magnitude) advantage over semiconductor CMOS circuits in switching power (FIG. 4). Third, this power must be removed at cryogenic temperatures, using inefficient refrigerators, so that the total electrical power at room temperature is many times larger than the cryogenic heat load. Further, as thermal isolation techniques improve, the intrinsic thermal load of the operating circuit will become relatively more important as a factor in determining the size of the refrigerator necessary to operate the system.

It is useful to distinguish the DC and AC properties of a superconducting logic circuit biasing network. The network must maintain the proper current biases on average (at DC), but also must maintain these proper biases on very short times, against transients and fluctuations that might tend to change the biases in a given branch. This is particularly important for RSFQ circuits, since these generate picosecond pulses, changing the gate impedance on this time scale from zero to an impedance of typically several ohms, and back again. A change in load on this timescale must not divert current into other branches of the network.

Clearly, a resistive network, where the resistances are much larger than the largest transient impedance of the loads, will work at both DC and at AC. A purely inductive network will work at AC but not at DC. This DC problem can be fixed by adding a series R to each L, such that the DC impedances are also properly balanced. This value of R in each leg must be much greater than the DC average impedance of each gate. This can result in a significant reduction in power dissipation, relative to a purely resistive network. However, the static power dissipation in the bias network will still be much larger than the dynamic power dissipation in the gates, which is undesirable in certain applications.

There is a further problem with a network comprised of superconducting inductors L. Because of the quantum nature of superconductors, any superconducting loop must quantize the magnetic flux in the loop in integral multiples of the single flux quantum $\Phi_0$=h/2e=2 pH-mA, corresponding to a net circulating current $LI=\Phi_0$ that never dies out. A series resistance will cause this current to die out very quickly, at a cost of power dissipation.

Eaton et al, U.S. Pat. No. 7,002,366, expressly incorporated herein by reference, propose a biasing scheme for superconducting gates that uses resistively shunted Josephson junctions (RSJs) as bias elements, based on their DC I-V characteristics. For a current equal to or slightly greater than the critical current $I_C$ of the RSJ, the current is almost constant, corresponding (for a range of voltages) to a constant current supply (see prior art FIG. 2). This might seem to be ideal for a bias current network for an array of superconducting gates. However, Eaton's design, as disclosed, will not function properly in practice, because the DC I-V curve of the RSJ does not apply for short times. Eaton notes that the RSJ is an oscillator at AC for $I>I_C$, and suggests applying an unspecified "damping impedance" in series with the RSJ, where this damping impedance may include one or more of a resistor, or an inductor, or a capacitor. This scheme also suggests using JJs in the resistive state (i.e. $I>I_C$), thus creating static power dissipation even while the circuit is in idle mode.

Eaton also does not address a bias network with multiple gates, in which any two parallel legs of the network form a Superconducting Quantum Interference Device (SQUID), which is well known in the prior art as a sensitive quantum-limited detector of magnetic flux. The I-V curve of a SQUID shows that the critical current $I_C$ is strongly modulated by flux periodically in $\Phi_0$. Such a small change in flux may be introduced not only by an external magnetic field, but also by stray inductance and transient currents. So the bias current in a given leg of an array is not determined simply by the I-V curve of a single junction. This SQUID effect can be reduced by adding a series resistance in the loop, breaking the superconducting order, but this would also increase the static dissipated power.

SUMMARY OF THE INVENTION

The invention provides a number of alternative methods to reduce or eliminate DC power dissipation in biasing resistors.

In a first embodiment, the "dual-function resistive bias approach", the value of the bias resistor is decreased to that of the usual shunt resistor, and the shunt resistor is eliminated, as shown in FIG. 5; compare with FIG. 3. Critical damping of the Josephson junction behavior is still necessary for proper functioning, but the damping and bias functionalities are combined in a single resistor. This reduces power dissipation by a factor of ten as compared with the prior art biasing scheme. Further, this design has been simulated, laid out (see FIG. 6B), and successfully tested for the Josephson transmission line (JTL).

In a second embodiment, the bias resistor in the conventional network is replaced with a superconducting inductor with true zero resistance and no other DC losses. The value of each respective inductance $L_n$ is selected such that the bias current of the given branch $I_n$ is inversely proportional to $L_n$, where $L_n I_n$ should be much greater than $\Phi_0$=h/2e=2 mA-pH, the superconducting flux quantum. As illustrated in FIG. 7, the average DC voltage at each current injection node is the same for all such nodes of the network. This valid for a class of circuits, for example a clock-signal distribution circuit, in which a clock signal comprised of SFQ voltage pulses at frequency $f_c$ is distributed through the circuit. In this case, the average voltage is $V=\Phi_0 f_c$; for $f_c$=40 GHz, V=80 µV. If the voltages on the current injection nodes were not equal, this would cause the currents to redistribute towards the nodes with smaller voltages, destabilizing the system. But if the voltages are equal, and if the voltage pulses in the parallel branches are synchronized, the current distribution should be very stable.

A third embodiment is known as the "junction-inductive" approach. For this approach, one may have at least one node that exhibits a maximum average DC voltage $V_{max}$, and at least one other node that exhibits a reduced DC voltage $V_n<V_{max}$. Those branches contacting a reduced voltage node must comprise a Josephson junction $J_n$ in series with the inductor $L_n$, as illustrated in FIG. 8. Each Josephson junction $J_n$ has a critical current $I_c$ equal to the desired bias current $I_n$ and is critically damped (typically with a shunt resistor), with a DC (average) current-voltage characteristic corresponding to FIG. 2. Note that this curve corresponds to a nearly ideal current limiter for $I=I_C$. As described above, the current will tend to redistribute from the node with $V_{max}$ to a lower-voltage node $V_n$. However, this will quickly cause the voltage across $J_n$ to rise, until the average voltage drop across $J_n$ is $V_{max}-V_n$. In general, the Josephson junctions automatically generate sufficient voltage to maintain the average voltage at the common node at $V_{max}$ in each respective branch, while also maintaining the current in each branch close to $I_n$. So the Josephson junctions function as "current limiter" devices. There may also be a Josephson junction in the branch with the largest voltage, but this junction would not be expected to switch. Further, one can view the branch with $V_{max}$ as a voltage regulator for the network. This voltage regulator must be able to redistribute the small amount of current needed to equalize the voltage in the other branch or branches.

FIG. 8 illustrates a case where a binary frequency divider cuts an input clock frequency $f_c$ in half, thus decreasing the voltage for that section of the circuit from $\Phi_0 f_c$ to $\Phi_0 f_c/2$. The junction $J_2$ generates an average voltage $\Phi_0 f_c/2$, thus regulating the average voltage in that branch to be $\Phi_0 f_c$.

It is to be understood that these are illustrative examples, and that designs that combine the features of the several approaches for appropriate circuits may be inferred by one skilled in the art.

A preferred biasing element consists of an RSJ with critical current $I_C$, in series with an inductance L, such that $LI_C \gg \Phi_0$. This large value of L substantially reduces the SQUID effect for the DC IV curves, so that the DC bias distribution is determined by $I_C$ of each leg of the network, while the AC bias distribution (i.e., for picosecond timescales) is determined by the relative L of each leg of the network. While the large inductance dissipates no static power, it may require a significant area within an integrated circuit.

The preferred biasing network is resistor-free, and does not dissipate energy in a static (non-active) mode and dissipates orders of magnitude less power than traditional RSFQ while operating.

Replacing a dissipative resistor with a Josephson junction as a current distributing element might seem a very simple solution. A Josephson junction's critical current is a natural current limiting phenomenon. When a shunted ($\beta_c \leq 1$, where $\beta_c$ is the junction damping coefficient) Josephson junction is connected to a very small ($V \ll I_C R_n$) DC voltage source, the resulting DC component of the current though the junction is almost precisely equal to its critical current. This allows use of non-hysteretic Josephson junctions as DC current distribution elements.

The necessary condition of such a current distribution scheme is that the voltage on the power line should be equal to or greater than the maximum possible DC voltage in the powered circuit. For almost all RSFQ circuits (with the exception of output amplifiers and some special-purpose SFQ pulse multipliers), the maximum possible voltage is $V_{max}=\Phi_0 f_{clk}$. In order to create such a voltage source we use a simple Josephson transmission line (JTL) connected through large inductances to the power line (see FIG. 10).

By applying to the feeding JTL SFQ pulses from the clock source, we create a DC voltage $V_{max}$ on the bias line. To prevent dynamic current redistribution and increase the impedance of the local bias current source, large inductances $L_b$ were serially connected to the bias junctions, providing filtering of the AC components. The maximum bias current dynamic deviation in this case is $\delta I=\Phi_0/L_b$. At $L_b=400$ pH, the current fluctuations do not exceed 5 µA.

The circuit has to be biased with the current just under the total critical current of bias junctions. So, in the passive state (when clock is not applied), an ERSFQ circuit (for energy-efficient RSFQ) does not dissipate any power at all (zero static power dissipation). After turning it on, i.e. applying a clock from the clock source, the total power dissipation of an ERSFQ circuit is $P=I_b \Phi_0 f_{clk}$, where $I_b$ is the total bias current for the circuit and $f_{clk}$ is its operating clock frequency.

The major advantage of ERSFQ is its compatibility with traditional RSFQ, meaning that RSFQ circuits can generally be converted to ERSFQ by simple substitution of each bias resistor with a corresponding $J_b$-$L_b$ couple. Note, however, that the typically required inductance to effectively avoid crosstalk through the biasing network requires an inductor which may be physically larger than the corresponding resistor. This may require changes in layout, and such layout changes may alter propagation delays. Thus, large (~400 pH) bias inductors may consume substantial space on a chip. Bias inductances are not particularly restricted in location, so they might be relocated to any place on a chip. For example, they might be moved under the ground plane by adding extra superconductor layer to the process. This layer can be made of superconductor with high kinetic inductance.

An ERSFQ-biased circuit may present a high time jitter due to unavoidable bias current fluctuations. This might be solved by increasing the value $L_b$ of a bias inductor and generally employing pipeline architecture in designing large circuits.

In order to obtain large inductance, both ground planes may be cut off from under the inductor. This creates additional pinning for magnetic flux, helping to mitigate the "flux trapping" problem, which results in pinning of Abrikosov vertices in superconducting circuitry.

Several chips were fabricated in order to benchmark ERSFQ technology. The output amplifiers have a separate power bus and were designed in standard RSFQ. The chip contained two (ERSFQ and RSFQ) versions of a D flip-flop with complementary outputs (DFFC) and two versions of a static frequency divider by 16. A sample chip layout for the frequency divider circuit (based on toggle flip-flops or TFFs) is shown in FIG. 11. Besides that, the chip has a test structure for the inductance Lb, which has shown a very good agreement with the designed value (0.4 nH).

The functionality test results for the standard DFFC showed that the circuit operated within 22% bias current margins. The operating region included the case when the total bias current exceeded total critical current of bias junction, in which circuit has static power dissipation. The ERSFQ version of the circuit operated within 26% bias current margins. Indeed, the margins were higher than those of its RSFQ counterpart.

To perform the high-speed test, a static frequency divider by $2^{20}$ was employed. This circuit is an excellent test bench for ERSFQ high-speed functionality. Each stage (out of a total 20) of the frequency divider (TFF) operates at its own frequency, i.e. creating different dc voltage drops. The correct operation of this circuit at high frequency should undoubtedly confirm the correctness of the principles of the ERSFQ bias scheme.

The most interesting experiment would be direct measuring of the bit-error rate (BER). In this experiment, we used two phase-locked generators, one for the high-frequency clock and the other for the low frequency reference signal. The maximum frequency we can apply to the chip through our standard cryoprobe is about 30 GHz. We used an on chip double-rate converter to double the clock frequency. So, the first stage of the frequency divider could operate at 60 GHz. Then, after dividing by factor of $2^{20}$, the signal goes through the output amplifier to oscilloscope, where it is compared with the reference signal.

The circuit worked correctly at up to 67 GHz clock frequency within +/−16% dc bias current margins. This shows that it could have worked at much higher frequency and 33 GHz is just a limit of our HF setup. At the nominal bias, we didn't observe any phase creep between the output and the reference signal during hours. That gives us BER estimate below $10^{-14}$.

The present ERSFQ approach to biasing single flux quantum circuits, including but not limited to RSFQ, provides zero static and minimal total power dissipation. Several circuit designs have been designed and successfully demonstrated at low frequency including D flip-flop with complementary outputs, and a static frequency divider. In addition, complete operation of a 20-stage static frequency divider at frequency up to 67 GHz was demonstrated, with +/−16% operating margins. The measured bit-error rate was below $10^{-14}$.

Energy-Efficient RSFQ logic with zero static power dissipation and the elimination of the resistor biasing network, retains essentially all RSFQ logic core advantages along with the vast established RSFQ circuit libraries. There are two somewhat different implementations: ERSFQ and eSFQ. The difference is mostly in the degree of modification of existing RSFQ gates to its energy-efficient versions.

Similar to the transition from a resistor-based gate interconnect originally used in RSFQ (R for Resistive) to the inductor-junction-based design in present day RSFQ (R for Rapid), Josephson junctions with inductors can replace bias resistors as elements setting up the required amount of DC bias current for a logic gate. These bias current junctions $J_B$ should have a critical current equal to the required bias current $I_B$. As evident from the over-damped junction current-voltage characteristics, such a junction can be an excellent current limiter the bias current. If the average voltage at the bias terminal $V_{GATE}$ is lower than voltage at the common node (bias bus) $V_B$, then the bias limiting junction $J_B$ would start to switch at $V_B$-$V_{GATE}$ average voltage. This would keep the bias current to a gate at the desired level. In general, these biasing Josephson junctions automatically generate sufficient voltage to maintain the average voltage at the common node at $V_B$ in each respective branch, maintaining the bias current in each branch close to the critical current of the limiting bias junction.

The current limiting junctions also play a role in maintaining the phase balance between gates during static periods (e.g., during a stand-by mode) and during power-up. During the power-up procedure, bias current will distribute along the bias bus. However there is a phase drop in the inductance of the superconducting current bus. Current limiting junctions will automatically switch until the compensation of this phase drop is achieved and proper biasing currents are set.

There is no advantage to have the bias bus voltage higher than that set by the maximum average gate voltage determined by the clock frequency, $V_{GATEMAX}=V_B=\Phi_0 f_C$. This also corresponds to the lowest power.

Having voltage bias determined by the SFQ clock frequency, it is possible to actively manage dynamic power dissipation by controlling SFQ clock network—turning the clock on or off for all or for particular circuit sections, operating at different clock rates (multiple clocking domains), local control, dynamic sleep regimes, etc. This enables an incredible flexibility in active power circuit management and will further enhance power efficiency of our energy-efficient SFQ circuits.

The above junction-limiting DC bias distribution can be used to deliver current bias to regular RSFQ gates. No redesign of the RSFQ gate equivalent circuits is required in order to implement such energy-efficient RSFQ (ERSFQ) circuits. The only difference from standard RSFQ circuits is the replacement of bias resistors with the limiting Josephson junctions and series inductances. Switching of current limiting junctions will compensate for imbalance of average voltages across different bias terminals. This process is automatic and will adaptively track the changes in the average voltages and phase accumulation during the circuit operation.

The exact moments of switching of the limiting junctions depends on data content and generally is not synchronous with the clock. Therefore, some variations of bias current are possible although not desirable. In order to reduce these variations and smooth out transients caused by switching of the limiting junctions, the series inductance $L_B$ should be sufficiently large. Each SFQ switching event changes the gate bias current by $\delta I = \Phi_0/L_B$. This current change should be at least less that the current bias margin for a particular RSFQ gate. In fact, a higher inductance $L_B$ is generally advised in order to minimize circuit timing variations caused by DC bias current variations. Otherwise, it will limit the maximum clock frequency.

The above ERSFQ approach allows us to achieve zero static power dissipation while retaining the conventional RSFQ circuit designs and dc power supply. However, the area of ERSFQ circuits can become larger due to the introduction of sizeable bias inductors. These are necessary to smooth out the bias current variations due to asynchronous SFQ switching of the limiting junctions during circuit operation. As shown below, it is possible to eliminate the need for the large bias inductors by forcing synchronous (at every clock cycle) phase compensation at gate bias terminals. This is realized in the energy-efficient RSFQ version with synchronous phase compensation (eSFQ). Similar to ERSFQ, the eSFQ approach relies on DC current biasing distributed via current limiting junctions. It is worth noting, that the large-value inductances $L_B$ are not necessary for biasing the clock JTL network. Generally, this network has the highest average voltage $\Phi_0 f_C$, and its bias limiting junctions never switch during operation. They only switch during biasing-up to compensate the phase drop along the bias bus. Consequently, any RSFQ gate with the same phase (average voltage) at bias terminals as one of the clock network will not experience switching of the bias limiting junctions during operation and, therefore, will not require large bias inductors.

Every clocked RSFQ gate has a decision-making pair—two serially-connected Josephson junctions. Every clock cycle, one of the pair junctions makes a $2\pi$ phase slip regardless of data content. Therefore the phase and average voltage across the decision-making pair is always the same as across the junctions in the clocking JTL. Unfortunately, this natural phase balance is not utilized, since the bias terminals for standard RSFQ (and therefore ERSFQ) gates are designed without regard to phase (average voltage) balancing.

In the eSFQ approach, the gate current bias is always introduced via the decision-making pair and avoids the necessity for large bias inductor $L_B$. A standard RSFQ gate may be slightly modified to be compatible with resistor-less biasing. This circuit is the D flip-flop (DFF), which permits a data bit to be stored in the cell until it is released by the SFQ clock. In the conventional prior-art RSFQ design on the left of FIG. 9A, the bias current injects current just above junction $J_2$, so the phase and average voltage are data-dependent. The clock line sends an SFQ pulse to the decision-making pair—a series combination of $J_3$ and $J_4$, such that in every case, one or the other (but not both) junctions switch. Therefore, for a clock input at a rate $f_C$, the voltage at the clock input is $\Phi_0 f_C$. In the eSFQ DFF design on the right of FIG. 9A, the current bias is inserted instead into the clock line. This permits this circuit to be biased with the same network that biases a clock distribution line, which also has an average voltage of $\Phi_0 f_C$. This change in bias point is not entirely trivial; the detailed parameters of the circuit have to be reoptimized with changes in selection of critical currents and inductor values, in order to maintain a large margin of operation. It will also pre-set a gate into logic "1" after biasing-up, which requires initial clock cycles to reset. Similar changes are possible for most clocked RSFQ logic gates.

A damped Josephson junction may also be added in series with the bias inductor in the eSFQ DFF design in the right of FIG. 9A, as shown by junction Jb in FIG. 9B. The critical current of the bias junction will be Ib, as in the ERSFQ approach. However, in the eSFQ design, all circuits are biased at the same average voltage $\Phi_0 f_C$, with all circuit-generated voltage pulses synchronized. This means that in steady-state operation, voltage switching of circuit elements will not insert additional magnetic flux in loops, so that all bias junctions will remain in their zero-voltage state just below Ic, not dissipating any power. In that case, a bias junction is not absolutely necessary. However, the bias junctions may be activated during power-up, power-down, and changes in voltage bias levels, and may assist in the stability of the circuit.

More drastic changes are required to data transmission circuits. In standard RSFQ, data is transported between clocked gates using asynchronous JTLs, mergers, splitters and PTLs (passive transmission lines). For the eSFQ implementation, clocked data transmission is used. This can be done with a shift register type circuit based on 2-junction cells. It is worth noting, that this RSFQ shift register can be biased according to eSFQ by a simple replacement of resistors with bias limiting junctions. The unit cell can be easily extended to perform SFQ merging and SFQ splitting functions.

One can also use supply-free JTLs made of underdamped Josephson junctions to facilitate a ballistic transfer of data SFQs (D. V. Averin, K. Rabenstein, and V. K. Semenov, "Rapid ballistic readout for flux qubits," Phys. Rev. B, vol. 73, 094504, 2006).

Other asynchronous circuits, e.g., toggle flip-flop (TFF), can be made 'supply-free", as all biasing done via adjacent JTLs (FIG. 9C). Similarly for the eSFQ implementation, these gates will be biased via clocked JTLs (FIG. 9D).

Although avoiding area-consuming large biasing inductances necessary for ERSFQ, additional junctions and the necessity for eSFQ of clocked data transmission circuits may bring circuit complications and latency. This should be mitigated by use of supply-free PTLs as much as possible.

Clocked PTL drivers can bring better data synchronization and can simplify timing. Since both ERSFQ and eSFQ use the same DC bias distribution network based on the use limiting junctions, they can be combined in the same circuit to achieve the best integrated circuit area utilization.

It is therefore an object to provide a superconducting integrated circuit, comprising a plurality of superconducting circuit elements, each having a variation in operating voltage over time; a common power line; and a plurality of bias circuits, each connected to the common power line, and to a respective superconducting circuit element, wherein each respective bias circuit is superconducting during at least one time portion of the operation of a respective superconducting circuit element, and is configured to supply the variation in operating voltage over time to the respective superconducting circuit element.

The operating voltage supplied by one of said bias circuits is preferably sufficiently decoupled from an operating voltage supplied by another one of said bias circuits to avoid interdependent operation of the plurality of superconducting circuit elements via dynamic currents passed through the common power line.

At least two of the bias circuits are preferably configured to supply a different average bias current to respective superconducting circuit elements.

Each bias circuit b preferably consists essentially of a superconducting inductor, having a respective inductance $L_b = N\Phi_0/I_b$, where N is greater than 1 and $\Phi_0$ is the magnetic flux quantum, and where N is essentially the same for each respective bias circuit.

Each of the superconducting circuit elements may have an associated design bias current $I_n$, and an expected instantaneous deviation from the design bias current $I_n$ in any superconducting circuit element is less than about $\delta I = \Phi_0/L_b$, $\delta I = I_b/N$.

At least one bias circuit may comprise a superconducting inductor and at least one shunted Josephson junction in series, wherein during the superconducting state of the respective bias circuit, the Josephson junction is operated below its critical current. The at least one Josephson junction may achieve a supercritical current during the variation in operating voltage over time. The least one Josephson junction, in some embodiments, does not achieve a supercritical current during the variation in operating voltage over time, after stabilization of a power supply voltage on the common power line.

An average power supply voltage on the common power line may be about equal to an average operating voltage of at least one of the plurality of superconducting circuit elements.

At least one superconducting circuit element may comprise a clock transmission line of a single flux quantum circuit, and the bias circuit comprises a superconducting inductor, the bias circuit providing an average bias voltage $V_c = \Phi_0 f_{clk}$, where $f_{clk}$ is a controlled clock frequency.

A total power dissipation of at least one respective bias circuit and a corresponding superconducting circuit element during normal operation of the superconducting integrated circuit after initialization, may be, in one embodiment, $V_c I_n$, wherein $V_c$ is an average bias voltage to the respective superconducting circuit element, and $I_n$ is a bias current supplied by the respective bias circuit.

The plurality of superconducting circuit elements may be single-flux-quantum logic circuits, or rapid single-flux-quantum logic circuits.

The common power line may have a voltage $V_c = \Phi_0 f_{clk}$, where $f_{clk}$ is a controlled clock frequency, wherein the superconducting circuit elements are each single-flux-quantum logic circuits subject to synchronous switching, independent of data sequences.

At least one bias circuit may comprise a Josephson junction having a critical current $I_n$, added for stability during current transients of a respective superconducting circuit element, wherein the junction remains in a zero-voltage state carrying a current below the critical current $I_n$ during steady-state operation of the respective superconducting circuit element.

The circuit may further comprise a second plurality of superconducting circuit elements, each having a variation in operating voltage over time; a second common power line, having a voltage controlled independently of the common power line, wherein the second common power line voltage can be controlled to supply zero power; and a second plurality of bias circuits, each connected to the common power line, and to a respective superconducting circuit element, wherein each respective bias circuit is superconducting during at least one time portion of the operation of a respective superconducting circuit element, and is configured to supply the variation in operating voltage over time to the respective superconducting circuit element, wherein at least on of the plurality of superconducting circuit elements produces an output signal which is received as an input signal by at least one if the second plurality of superconducting circuit elements.

The common power line may have an average voltage established by a periodic series of single flux quantum pulses in a set of parallel Josephson junctions coupled to the common power line.

It is also an object of the invention to provide a superconducting integrated circuit, comprising a plurality of superconducting circuit elements, each having at least two different states, which are reflected as a variation in operating voltage over time; a common power line; and a plurality of current bias circuits, each connected to the common power line, and to a respective superconducting circuit element, wherein the current bias circuit has superconducting resistance during at least one state of a respective superconducting circuit element, and is configured to supply a substantially constant current to the respective superconducting circuit element during the at least two different states, wherein the constant current in one of said current bias circuits is decoupled from a constant current in another one of said current bias circuits. At least one bias circuit may have a superconducting resistance throughout the variation in operating voltage over time of a respective superconducting circuit element. At least one bias circuit may have a non-superconducting resistance state during at least a portion of the variation in operating voltage over time of a respective superconducting circuit element. At least one bias circuit may have a non-superconducting resistance state only during a transient state of the superconducting integrated circuit.

It is a still further object to provide a method of biasing a superconducting integrated circuit, having a common power line, a plurality of bias circuits connected to the common power line, and a plurality of superconducting circuit elements, each biased by a respective bias circuit, each having a variation in operating voltage over time, comprising supplying the variation in operating voltage over time to the respective superconducting circuit element with the respective bias circuit; and operating each bias circuit in a lossless mode during at least one time portion of the operation of a respective superconducting circuit element. The method may further comprise sufficiently decoupling the operating voltage supplied by one of said bias circuits from an operating voltage supplied by another one of said bias circuits to avoid interdependent operation of the plurality of superconducting circuit elements via dynamic currents passed through the common power line. The method may also further comprise supplying a different average bias current to respective different superconducting circuit elements.

At least one bias circuit may comprise a superconducting inductor and at least one shunted Josephson junction in series, further comprising, during the lossless mode of the respective bias circuit, operating the Josephson junction below its critical current.

During a normal operation of a respective superconducting circuit element having variation in operating voltage over time, the at least one shunted Josephson junction may be operated at a supercritical current.

During normal logical operation of a respective superconducting circuit element having variation in operating voltage over time excluding non-logical operation-induced transient conditions, the at least one shunted Josephson junction may be operated below a critical current.

The method may further comprise establishing an average voltage in the common power line by supplying a periodic series of single flux quantum pulses in a set of parallel Josephson junctions coupled to the common power line.

It is a still further object to provide a superconducting integrated circuit comprising a plurality of logic elements, at least one of said logic elements comprising at least two Josephson junctions and forming a superconducting flip flop; and a plurality of biasing networks configured to bias a respective logic element, each biasing network comprising a superconducting inductor and a Josephson junction in series, having a static impedance and a dynamic impedance, the biasing network having a sufficiently large dynamic impedance to block voltage pulses from a respective logic element from propagating through the respective biasing network of sufficient amplitude to cause a logic error in a logic element, and having a static impedance substantially less than the dynamic impedance.

Another object provides a Josephson junction-based logic integrated circuit, having at least two logic elements each with a respective biasing network having a superconducting inductor in series with an optional Josephson junction having a static superconducting impedance associated with a low static power consumption which provides a bias current for circuit element static operation, and having a high dynamic impedance associated with a high dynamic power consumption sufficient to isolate a first logic element from a second logic element, wherein the bias current through the biasing network to a respective logic element is inversely proportional to the bias inductance value.

A further object provides a superconducting integrated circuit, comprising a plurality of interconnected superconducting information processing elements, having an average bias voltage dependent on a data sequence, each being statically biased near to, but less than, a critical current for a superconducting junction of a respective superconducting information processing element and being associated with a dynamic power dissipation greater than two times a respective static power dissipation; and a biasing network comprising a superconducting inductor, configured to dynamically isolate and independently bias each of the superconducting information storage elements, while substantially isolating a dynamic bias state for each of the plurality of superconducting information storage elements, while maintaining stability over a range of data sequences.

A still further object provides a method of biasing a superconducting integrated circuit, comprising providing a plurality of superconducting junctions, having a data sequence dependent bias voltage and each being biased near to, but less than, a critical current for the respective junction; and biasing the plurality of superconducting junctions with a biasing network comprising a superconducting inductor, the biasing network having a static power dissipation of less than about two times a respective dynamic power dissipation of the plurality of junctions, having a sufficiently high dynamic impedance to substantially isolate a dynamic bias state for each of the plurality of junctions to prevent a state of one superconducting junction from altering a state of another superconducting junction by a propagation of a pulse through the biasing network, and maintaining stability of operation over a range of data sequences.

Having a bias voltage determined by the SFQ clock frequency, it is possible to actively manage dynamic power dissipation by controlling SFQ clock network and, therefore, bias bus voltage. By turning the clock on or off for all or for particular circuit sections, one can achieve "zero power mode," i.e. a complete zero power including dynamic power $P_D$. This mode—zero power with zero circuit activity—is particularly difficult to achieve in CMOS. This enables one to operate at different section of the circuit at different clock rates and power (multiple clocking domains), provide a local control, dynamic sleep regimes, etc. This is particularly valuable for circuits operating in "burst mode," e.g., for detector and qubit readout. This enables a significant flexibility in active power circuit management and will further enhance power efficiency of our energy-efficient SFQ circuits.

Further object will become apparent from a review of the drawings and detailed description of the preferred embodiments.

BRIEF DESCRIPTION OF THE DRAWINGS

FIG. 1 shows a resistive bias current distribution network for RSFQ circuits of the prior art.

FIG. 2 shows a DC V(I) relation for a resistively shunted Josephson junction of the prior art.

FIG. 3 shows a circuit schematic explicitly showing both bias resistors $R_b$ and shunt resistors $R_n$ of the prior art.

FIG. 4 shows the Power-Delay plot for superconductor and semiconductor device families.

FIG. 5 shows a schematic of a section of a dual function resistive bias circuit.

FIG. 6A shows a layout of a section of a conventional resistive bias of the prior art.

FIG. 6B shows a dual-function resistive bias corresponding to the circuit of FIG. 6A.

FIG. 7 shows a pure inductive bias current distribution network, for a circuit where the average voltages at each current injection node are identical.

FIG. 8 shows a junction-inductive bias current distribution network for non-identical device sub-circuit voltages, with series Josephson junctions to limit current.

FIG. 9A shows how the bias design for a sample RSFQ circuit (left) may be modified for pure inductive bias using the eSFQ approach on the right.

FIG. 9B shows how the eSFQ circuit of FIG. 9A may include an optional bias junction Jb for additional circuit stability.

FIG. 9C shows a standard asynchronous RSFQ Josephson transmission line (JTL) of the prior art.

FIG. 9D shows a clocked JTL that is compatible with eSFQ design.

FIG. 10 shows a design of a voltage regulator circuit locked to a clock for junction-inductor biasing of an RSFQ circuit based on the ERSFQ approach.

FIG. 11 shows an integrated circuit layout for a 4-bit binary RSFQ counter with a biasing network based on the ERSFQ junction-inductor bias approach.

DETAILED DESCRIPTION OF THE INVENTION

The several preferred embodiments are hereby described in greater detail, with reference to the figures.

FIG. 1 of the prior art shows a current source providing bias current to two Josephson transmission lines (JTLs), one on the top and the other on the bottom. A JTL comprises a set of parallel Josephson junctions (each symbolized by 'X') connected by small inductors, and functions as an active transmission line for SFQ pulses.

A set of parallel resistors $R_b$ is used to bias the set of JTLs at a constant current less than the critical current $I_c$ of the junctions, so that there is no voltage or static power in the junctions. When an SFQ voltage pulse is introduced at one end of the JTL, it causes each junction in turn to exceed $I_c$ in a transient fashion, generating an SFQ pulse which propagates to the next junction.

Each Josephson junction in FIG. 1 is actually a damped Josephson junction. While there are technologies whereby sufficient damping can be provided by the junction itself, in most cases additional damping is needed (to achieve "critical damping") and is provided by a resistor that shunts the intrinsic junction. Indeed, separate control over damping may be advantageous. The DC current-voltage characteristic of such a shunted junction is shown in FIG. 2, and has a critical current $I_c$, below which the voltage is zero. The shunting resistor $R_n$ for each junction is shown explicitly in FIG. 3, which represents two parallel Josephson junctions within a Josephson transmission line, and also shows the bias resistors $R_b$. In conventional RSFQ design, $R_b$ is typically a factor of ten larger than $R_n$, in order to maintain constant current while also maintaining appropriate isolation between the various junctions. Note that in FIG. 3 (and FIG. 5), each 'X' represents an intrinsic (underdamped) Josephson junction. In contrast, in FIG. 1, as well as in FIGS. 8-10, each 'X' represents a shunted (damped) junction.

FIG. 4 shows the comparative power dissipation and gate delay of various advanced electronic technologies of the prior art. In general, all technologies offer a tradeoff between power and speed; faster devices tend to dissipate more power. The line labeled RSFQ shows that these devices are very fast with low power dissipation (compared with semiconductor technologies in the right half of the figure), but most of the power is actually associated with the static bias distribution. The line labeled 'eSFQ' represents the ultimate limit of RSFQ, based only on the dynamic switching power of the Josephson junctions. There are several potential applications that may warrant such ultra-low power, including parallel supercomputing, quantum computing, and digital processing for cryogenic sensor arrays.

FIG. 5 shows how FIG. 3 can be modified within the dual-function resistive bias approach, for a biased JTL. Here, each 'X' represents an intrinsic unshunted junction. An isolated junction of this type, driven by a constant bias current I, would generate a hysteretic I-V curve quite unlike that for the damped junction as shown in FIG. 2. Further, such an undamped junction triggered by an SFQ pulse would switch into the voltage state and oscillate for many oscillations (corresponding to many SFQ pulses) before eventually damping out. This would be highly undesirable for a digital technology. This is well known in the prior art, and this is why the damping needs to be added. However, according to one embodiment, an appropriate biasing scheme can also provide the requisite damping without the need for a shunt resistor. Here, the biasing resistor $R_b$ is reduced to a value comparable to the shunt resistor $R_n$ of the conventional case. Furthermore, if there are many junctions being biased in parallel, there is an effective resistance to ground from the voltage bias line of $R_{buf} \sim R_n/N$, where N is the number of parallel branches of the biasing network. So for this large network, the effective resistance to ground shunting each junction is only marginally greater than $R_n$. Further, using the bias resistor as the damping shunt inevitably leads to some coupling between parallel branches, which would cause possible concern. However, simulations and measurements have shown that for a large number of parallel branches, this coupling does not generate bit errors within the circuit, and can be neglected. A key advantage, of course, is that the static power dissipation is reduced by a factor of about ten relative to the conventional resistive bias approach.

FIG. 6A shows an example of a circuit layout for a section of two JTLs in conventional resistive bias, and FIG. 6B shows an example of a dual-function resistive bias approach. In both cases, there is a central (left-right) voltage bias bus, with bias resistors going to signal lines on the top and bottom. The width of the signal lines gives the scale of the devices, about 2 μm for the circuits here. The resistors are made with a resistive layer having a sheet resistance of 2 ohms/square. For the conventional approach in FIG. 6A on the left, the bias resistors require a meander line of order 10 squares long, while the shunt resistors are of order 1 square. In contrast, for the dual-function resistive bias approach in FIG. 6B on the right, there is only a small bias resistor of order 1 square, and no shunt resistor. Remarkably, both circuits have been simulated and measured to exhibit virtually the same electrical behavior for propagating SFQ pulses, despite the sharp difference in power dissipation.

FIG. 7 shows a block diagram for a simple SFQ circuit, a JTL (comprised of several JTL sections) with pure inductive bias. Here, it is assumed that the Josephson junctions in the JTL are damped by resistive shunts as in the conventional resistive approach, and the signal input to the JTL is a clock signal of a periodic sequence of SFQ pulses at the clock rate $f_c$. The average DC voltage on each junction in the JTL is then $V=\Phi_0 f_c$, and that is also the voltage on the bias line, since the inductors do not sustain a DC voltage. In the general case, the bias currents $I_n$ could be different, and so could the inductors $L_n$. When the power is first turned on, the currents will distribute in inverse proportion to each value $L_n$, assuming that the effective impedance during turn-on is dominated by these inductors. Note that a Josephson junction below $I_c$ is also effectively a nonlinear inductance having a value of the Josephson inductance $$L_J = \Phi_0/[2\pi(I_c^2 - I^2)^{1/2}].$$

So if we ensure that the bias inductors $L_n$ are large compared to $\Phi_0/I_c$, then the initial current distribution should be dominated by the values of $L_n$. This will also ensure that the bias inductors effectively screen the individual SFQ pulses from coupling between the branches of the bias network.

As for the case shown in FIG. 7, the average voltage at each current insertion point is the same, in this case $\Phi_0 f_c$. As stated above, if the average voltages are different, the current will tend to redistribute away from the high-voltage branches to the low-voltage branches very quickly. To take a specific example that illustrates this, note that $\Phi_0 = 2$ mA-pH, and consider a reasonably large value $L_n \sim 100$ pH. Then, if one had a voltage difference as small as 1 μV, one obtains $dI/dt \sim V/L_n \sim 10^4$ A/s. For typical bias currents ~1 mA, this would completely deplete this branch in 100 ns. This is generally unacceptable, and emphasizes that the insertion voltages should generally be exactly the same in all branches for this pure inductive biasing approach. This will be the case in clock signal distribution lines, or in clocked circuits that are guaranteed to switch once each clock period. An example of such a circuit is described with regard to FIG. 9A below. In these cases, not only is the time-averaged voltage the same, but the magnetic flux (and the corresponding superconducting phase difference) in the bias loops should also be the essentially constant, with no tendencies to redistribute current from one branch to the next. This makes for a very stable configuration. Further, this pure inductive bias approach completely eliminates the static power dissipation, leaving only the dynamic power intrinsically associated with the SFQ pulses.

FIG. 8 illustrates an example whereby the voltages are not the same at all nodes, and shows how the junction-inductive bias approach (also known in this context as ERSFQ) can handle this successfully. In this example, the signal input is an SFQ pulse sequence at a clock frequency $f_c$, the same as for FIG. 7. However, the output of the first JTL stage goes to a toggle-flip-flop (TFF) which functions as a binary frequency divider, sending to its output only every other alternate input pulse. In this way, the output pulse stream (which is propagated by the output JTL) is at a data rate of $f_c/2$. Therefore, the average insertion voltage for the input JTL is $\Phi_0 f_c$, while that for the output JTL is $\Phi_0 f_c/2$. Clearly, this would be incompatible with the pure inductive bias of FIG. 7. However, we select the critical current $I_c$ of each junction $J_n$ to be equal to the bias current $I_n$ in that branch. In that case, while the bias current will start to redistribute from branch 1 toward branch 3 (with the reduced voltage), junction $J_3$ acts as a current limiter, quickly establishing an average voltage $\Phi_0 f_c/2$ which then maintains a bias voltage of $\Phi_0 f_c$ on all branches of the networks. While this junction-inductive ERSFQ biasing scheme does permit a small current redistribution if sub-circuits have data-dependent voltages, this should be negligible for a properly designed system. Furthermore, although the bias junction does dissipate some power, this extra power is much less than that of the bias resistor that is replaced. The total power dissipation would be $I_b \Phi_0 f_c$, of which typically less than half would come from the bias junctions. This is still at least a factor of 10 reduction from the conventional resistive bias.

Note that the junction $J_1$ is not necessary, since it is in the branch with the maximum voltage $V_{max}$, which will see its current decrease (very slightly) rather than increase. So in steady state, there should ideally be no voltage across $J_1$, and a pure inductive bias could be used in this branch. On the other hand, there may be some advantages to including this junction. For example, if there are two or more branches corresponding to $V_{max}$, then this may form a superconducting loop that could trap magnetic flux, leading to a large circulating current. Such trapped flux can cause problems in RSFQ circuits, by coupling stray magnetic flux to another part of the circuit. On the other hand, if there is a junction in the loop, this trapped flux would be more likely to escape. Furthermore, during transients such as power-up and power-down, junction $J_1$ may be activated, so that its presence may enhance the stability of the system.

FIG. 8 shows the inductors in contact with the voltage bias bus, and the junctions in contact with the RSFQ circuit, but this is not necessary. These could equally well be inverted in any given branch. Further, the inductor could be split in two, with the junction in between. In addition, one could use more than one Josephson junction in series for a given branch. This would tend to increase the voltage-compliance of this current regulator, assuming that $I_c$ for the junctions is the same. In principle, one could even use the nonlinear Josephson inductance of an array of junctions to obtain a sufficiently large series inductance, without the need for a separate linear inductor.

FIG. 9A presents the schematic of a standard RSFQ cell that is slightly modified to be compatible with pure inductive bias. This circuit is the data-flip-flop or DFF, which permits a data bit to be stored in the cell until it is released by the output trigger, which is usually a clock signal. In the conventional design on the left, the bias current injects current just above junction $J_2$, so the average voltage is data-dependent. The trigger (clock) line sends an SFQ pulse to the series combination of junctions $J_3$ and $J_4$, such that in every case, one or the other (but not both) junctions switch. These two junctions form what is known as a "decision-making pair", which is a common configuration in RSFQ logic. Therefore, for a clock input at a rate $f_c$, the voltage at the clock input is $\Phi_0 f_c$. In the slightly modified DFF design on the right, the current bias is inserted instead into the clock line. This permits this circuit to be biased with the same network that biases a clock distribution line, for example, which also has an average voltage of $\Phi_0 f_c$. This change in bias point is not entirely trivial; the detailed parameters of the circuit would need to be reoptimized for this change, with possible changes in critical currents and inductor values, in order to maintain a large margin of operation. Similar changes should be possible for most RSFQ logic gates. In this way, the bias voltage at all circuit injection points will have exactly the same average voltage of $\Phi_0 f_c$, and furthermore the voltage pulses in adjacent injection points are synchronized by the same clock and hence are essentially identical. So the instantaneous voltages in each branch are the same, thus there will be no tendency for currents to redistribute from one branch to another. This will enable the bias inductors $L_b$ in the bias lines to be reduced from the large values ($L_b$ much larger than $\Phi_0/I_b$) required for stability with asynchronous system operation. Given that these large bias inductors may take up a large area in the integrated circuit layout, the reduction in bias inductor values represents a significant advantage of the eSFQ approach.

While a Josephson junction in series with the bias inductor is not strictly necessary in the eSFQ design in the right of FIG. 9A, a junction $J_b$ may be added as shown in FIG. 9B. Since the instantaneous bias voltages in neighboring bias network branches are essentially the same, there will be no current redistribution in steady-state operation, and hence the bias junctions will remain in their zero-voltage state with current I just below the critical current $I_c=I_b$. On the other hand, in transient operation such as power-up or power-down, the bias junctions are available to permit quick system adjustment toward stable operation. Therefore, bias junctions may generally be used in eSFQ designs, as well.

Other RSFQ circuits which could be modified for compatibility with eSFQ biasing include data distribution lines. This would include reducing the use of asynchronous JTLs, splitters and confluence buffers, and instead using passive transmission lines with clocked transmitter and receiver circuits. In this way, it is likely that an entire RSFQ cell library could be adapted to eSFQ biasing. One alternative to the standard asynchronous JTL (FIG. 9C) is a eSFQ clocked JTL shown in FIG. 9D. Here the single row of junctions on the left is replaced with a dual row of clocked decision-making junction pairs, configured so that at every clock cycle, either the top junction or the bottom junction is triggered. In this way, the instantaneous voltage at the current insertion point is synchronized to that of a clock distribution line.

Alternatively, one could use the ERSFQ approach, whereby such cell modifications are unnecessary. In this case, one simply replaces each conventional bias resistor with a series combination of an inductor and a Josephson junction with $I_c=I_n$. A further variant that combines aspects of both methods is shown in FIG. 10. Here one has an RSFQ circuit which is biased with the junction-inductive approach with insertion voltages less than or equal to $\Phi_0 f_c$. In addition, the top of FIG. 10 shows a JTL fed by a sequence of clock pulses at $f_c$, corresponding to a voltage of $\Phi_0 f_c$, with a pure inductive bias. In effect, this JTL provides a voltage regulation circuit, which can supply current to the RSFQ circuit on the bottom to maintain the fixed voltage. This voltage regulator can comprise the actual clock distribution network or other circuits at this voltage, or a special circuit segment dedicated to this purpose. In this way, one has both current stabilization (provided by the series junctions) and voltage stabilization (provided by the clock and the inductive-biased JTL).

FIG. 11 is a sample integrated-circuit layout of a circuit similar to that shown in FIG. 10. This comprises an inductive-biased JTL on the top right, with a clock input at $f_c$, providing the voltage stabilization for a 4-bit RSFQ binary counter that is comprised of four TFFs with JTL stages between them. In the same way as shown in FIG. 8, each TFF stage reduces the clock frequency by a factor of two, for a total factor of 16 reduction in data rate. Therefore, the average voltage at the output of each TFF drops by a factor of two from its input. The current bias lines for the binary counter include a Josephson junction in series with the inductors, as indicated in FIG. 10. These junctions permit the total bias voltage to be $\Phi_0 f_c$, even for the branches that correspond to SFQ pulses at reduced rates.

The bias inductors in FIG. 11 are the small boxes, each with two smaller boxes inside. Each inductor actually consists of two inductors in series, where each inductor has three turns and a hole in the ground plane to increase inductances. One of each inductor pair is wound clockwise, and the other counterclockwise, in an effort to reduce stray magnetic flux that might be coupled to other parts of the circuit. The inductances are estimated to be of order 100 pH.

These preferred embodiments provide examples of the application of the design methods of this invention, and may be combined or modified to achieve the optimum combination of power reduction, bias stability, operating margin, and fabrication yield.

The present invention has been described here by way of example only. Various modification and variations may be made to these exemplary embodiments without departing from the spirit and scope of the invention, which is limited only by the appended claims.

REFERENCES

The following references are each expressly incorporated herein by reference in their entirety:

[1] S. Ruth, "Green IT—more than a three percent solution," *IEEE Internet Computing*, pp. 80-84, July/August 2009.

[2] A. Geist "Paving the roadmap to Exascale," *SciDAC Review*, No. 16, 2010. Available: www.scidacreview.org.
[3] S. Mukhopadhyay, "Switching energy in CMOS logic: how far are we from physical limit," 2006. Available: nanohub.org/resources/1250.
[4] V. V. Zhirnov, R. K. Cavin, J. A. Hutchby, and G. I. Bourianoff, "Limits to binary Logic Switch Scaling—A Gedanken Model", *Proc. IEEE*, vol. 91, pp. 1934-1939, November 2003.
[5] K. Likharev and V. Semenov, "RSFQ logic/memory family: A new Josephson-junction technology for sub-terahertz clock-frequency digital systems", *IEEE Trans. Appl. Supercond.*, vol. 1, pp. 3-28, March 1991.
[6] W. Chen, A. V. Rylyakov, V. Patel, J. E. Lukens, and K. K. Likharev "Superconductor digital frequency divider operating up to 750 GHz", Appl. Phys. Lett., vol. 73, pp 2817-2819, November 1998.
[7] O. Mukhanov, D. Gupta, A. Kadin, and V. Semenov, "Superconductor Analog-to-Digital Converters," *Proc. of the IEEE*, vol. 92, pp. 1564-1584, October 2004.
[8] O. A. Mukhanov, D. Kirichenko, I. V. Vernik, T. V. Filippov, A. Kirichenko, R. Webber, V. Dotsenko, A. Talalaevskii, J. C. Tang, A. Sahu, P. Shevchenko, R. Miller, S. B. Kaplan, S. Sarwana, and D. Gupta, "Superconductor Digital-RF receiver systems," *IEICE Trans. Electron.*, vol. E91-C, pp. 306-317, March 2008.
[9] A. Fujimaki, M. Tanaka, T. Yamada, Y. Yamanashi, H. Park, N. Yoshikawa, "Bit-serial single flux quantum microprocessor CORE," *IEICE Trans. Electron.*, vol. E91-C pp. 342-349, March 2008.
[10] Y. Yamanashi, T. Kainuma, N. Yoshikawa, I. Kataeva, H. Akaike, A. Fujimaki, M. Tanaka, N. Takagi, S. Nagasawa, M. Hidaka, "100 GHz demonstrations based on the single-flux-quantum cell library for the 10 kA/cm2 Nb fabrication process," *IEICE Trans. Electron.*, vol. E93-C pp. 440-444, April 2010.
[11] A. Rylyakov, "New design of single-bit all-digital RSFQ autocorrelator", *IEEE Trans. Appl. Supercond.*, vol. 7, pp. 2709-2712, June 1997.
[12] N. Yoshikawa, Y. Kato, "Reduction of power consumption of RSFQ circuits by inductance-load biasing," *Supercond. Sci. Technol.*, vol. 12, pp. 918-920, November 1999.
[13] Y. Yamanashi, T. Nishigai, N. Yoshikawa, "Study of LR-loading technique for low-power single flux quantum circuits," *IEEE Trans. Appl. Supercond.*, vol. 17, pp. 150-153, June 2007.
[14] A. Rylyakov and K. Likharev, "Pulse jitter and timing errors in RSFQ circuits", *IEEE Trans. Appl. Supercond.*, vol. 9, pp. 3539-3444, June 1999.
[15] S. Polonsky, "Delay insensitive RSFQ circuits with zero static power dissipation," *IEEE Trans. Appl. Supercond.*, vol. 9, pp. 3535-3538, June 1999.
[16] A. H. Silver, Q. P. Herr, "A new concept for ultra-low power and ultrahigh clock rate circuits," *IEEE Trans. Appl. Supercond.*, vol. 11, pp. 333-336, June 2001.
[17] S. M. Schwarzbeck, K. Yokoyama, D. Durand, R. Davidheiser, "Operation of SAIL HTS digital circuits near 1 GHz," *IEEE Trans. Appl. Supercond.*, vol. 5, pp. 3176-3178, June 1995.
[18] Q. P. Hen, A. Y. Hen, O. T. Oberg and A. G. Ioannidis, "Ultra-Low-Power Superconductor Logic," submitted for publication.
[19] O. A. Mukhanov, D. E. Kirichenko, and A. F. Kirichenko, "Low power biasing networks for superconducting integrated circuits," Patent application 61/250,838, Oct. 12, 2009.
[20] K. K. Likharev, O. A. Mukhanov, and V. K. Semenov, "Resistive Single Flux Quantum logic for the Josephson-junction digital technology," in SQUID'85, Berlin, 1985, pp. 1103-1108.
[21] O. A. Mukhanov, V. K. Semenov, and K. K. Likharev, "Ultimate performance of the RSFQ logic circuits," *IEEE Trans. Magn.*, vol. MAG-23, pp. 759-762, March 1987.
[22] D. E. Kirichenko, A. F. Kirichenko, S. Sarwana, "No static power dissipation biasing of RSFQ circuits," *IEEE Trans. Appl. Supercond.*, submitted for publication.
[23] HYPRES Design Rules. Available: www.hypres.com.
[24] O. A. Mukhanov, S. V. Polonsky, and V. K. Semenov, "New Elements of the RSFQ Logic Family," *IEEE Trans. Magn.*, vol. MAG-27, pp. 2435-2438, March 1991.
[25] O. A. Mukhanov, "RSFQ 1024-bit shift register for acquisition memory," *IEEE Trans. Appl. Supercond.*, vol. 3, pp. 3102-3113, December 1993.
[26] S. V. Polonsky, V. K. Semenov, P. Bunyk, A. F. Kirichenko, A. Kidiyarova-Shevchenko, O. A. Mukhanov, P. Shevchenko, D. Schneider, D. Y. Zinoviev, and K. K. Likharev, "New RSFQ Circuits," *IEEE Trans. Appl. Supercond.*, vol. 3, pp. 2566-2577, March 1993.
[27] C. Bennett, "Logical reversibility of computation," *IBM J. Res. Devel.*, vol. 17, pp. 525-532, 1973
[28] K. K. Likharev, "Dynamics of some single flux quantum devices," *IEEE Trans. Magn.*, vol. MAG-13, pp. 242-244, January 1977.
[29] W. Hioe and E. Goto, *Quantum Flux Parametron*. World Scientific, 1991.
[30] K. K. Likharev, S. V. Rylov, V. K. Semenov, "Reversible conveyer computations in arrays of parametric quantrons," *IEEE Trans. Magn.*, vol. MAG-21, pp. 947-950, March 1985.
[31] S. V. Rylov, V. K. Semenov, K. K. Likharev, "DC powered parametric quantron," in *Proc. ISEC*, Tokyo, August 1987, pp. 135-138.
[32] V. Semenov, G. Danilov, D. Averin, "Negative-inductance SQUID as the basic element of reversible Josephson-junction circuits," *IEEE Trans. Appl. Supercond.*, vol. 13, pp. 938-943, June 2003.
[33] V. Semenov, G. Danilov, D. Averin, "Classical and quantum operation modes of the reversible Josephson-junction logic circuits," *IEEE Trans. Appl. Supercond.*, vol. 17, pp. 455-461, June 2007
[34] J. Ren, V. Semenov, Yu. Polyakov, D. Averin, J.-S. Tsai, "Progress toward reversible computing with nSQUID arrays," *IEEE Trans. Appl. Supercond.*, vol. 19, pp. 961-967, 2009.
[35] V. Semenov, J. Ren, Yu. Polyakov, D. Averin, J.-S. Tsai, "Reversible computing with nSQUID arrays," in *Proc. 12th Int. Supercond. Electr. Conf.*, Fukuoka, 2009, paper SP-P27.
[36] A. M. Kadin, R. J. Webber, and D. Gupta, "Current leads and optimized thermal packaging for superconducting systems on multistage cryocoolers", *IEEE Trans. Appl. Supercond.*, vol. 17, pp. 975-978, June 2007.
[37] R. J. Webber, J. Delmas, B. H. Moeckly, "Ultra-low heat leak YBCO superconducting leads for cryoelectronic applications", *IEEE Trans. Appl. Supercond.*, vol. 19, pp. 999-1002, June 2009.
[38] A. Inamdar, S. Rylov, S. Sarwana D. Gupta, "Superconducting switching amplifiers for high speed digital data links," *IEEE Trans. Appl. Supercond.*, vol. 19, pp. 999-1002, June 2009.

[39] K. D. Choquette, K. L Lear, R. E. Leibenguth, and M. T. Asom, "Polarization Modulation of Cruciform Vertical-Cavity Laser Diodes," *Appl. Phys. Lett.*, vol. 64, pp. 2767-2769, 1994.

[40] H. Wei, N. Patil, A. Lin, H.-S. P. Wong, S. Mitra, "Monolithic three dimensional integrated circuits using carbon nanotube FETs and interconnects," in *Proc. IEEE Int. Electron Dev. Meeting (IEDM)*, Baltimore, 2009, paper 23.5.

[41] M. T. Niemier, X. S. Hu, M. Alam, G. Bernstein, W. Porod, M. Putney, J. DeAngelis, "Clocking structures and power analysis for nanomagnet based logic devices", in *Proc. ISLPED '07*, Portland, 2007.

[42] V. K. Semenov, "Digital to analog conversion based on processing of the SFQ pulses", IEEE Trans. Appl. Supercond., vol. 3, pp. 2637-2640, March 1993

[43] A. F. Kirichenko, V. K. Semenov, Y. K. Kwong, and V. Nandakumar, "4-bit Single Flux Quantum Decoder," IEEE Trans. on Appl. Supercond., vol. 5, no. 2, 1995, p. 2857.

[44] A. Fujimaki, Y. Hogashi, S. Miyajima, T. Kusumoto, "Event-driven dual channel oversampled analog-to-digital converter for a detector system", Submitted for publication to this issue of IEEE Trans. Appl. Supercond

What is claimed is:

1. A biasing network for a biasing circuit elements in a plurality of parallel circuit branches, comprising:
    a current distribution network;
    a bias element for each respective parallel circuit branch, comprising at least one Josephson junction having a critical current $I_C$ connected in series with at least one inductor, effective for biasing the respective circuit branch with a bias current $I_n$ and for critically damping at least one Josephson junction within the respective circuit branch;
    each bias element communicating a respective bias current $I_n$ from the current distribution network to respective circuit elements in each respective circuit branch,
    each bias element having a respective inductance $L_n$ such that the respective bias current $I_n$ of each respective circuit branch is inversely proportional to $L_n$, where $L_n I_n$ is greater than $\Phi_0 = h/2e = 2$ mA-pH.

2. The biasing network according to claim 1, wherein at least one first circuit element in a first respective circuit branch has a different respective operating voltage than at least one second circuit element in a second respective circuit branch.

3. The biasing network according to claim 1, wherein at least one first circuit element in a first respective circuit branch has a different respective bias current $I_C$ than at least one second circuit element in a second respective circuit branch.

4. The biasing network according to claim 1, wherein at least one first circuit element in a first respective circuit branch comprises of a Josephson junction connected to a ground.

5. The biasing network according to claim 1, wherein at least one first circuit element in a first respective circuit branch comprises of a Josephson transmission line (JTL).

6. The biasing network according to claim 1, wherein at least one first circuit element in a first respective circuit branch comprises of a superconducting flip flop.

7. The biasing network according to claim 1, wherein at least one first circuit element in a first respective circuit branch comprises of a superconducting toggle flip-flop (TFF).

8. The biasing network according to claim 1, wherein at least one first circuit element in a first respective circuit branch comprises of a single flux quantum logic element.

9. The biasing network according to claim 1, wherein the at least one inductor for each respective circuit branch is a superconducting inductor.

10. The biasing network according to claim 1, wherein the bias element for each respective circuit branch functions as a current limiter.

11. The biasing network according to claim 1, at least one circuit branch comprises a Josephson junction circuit substantially without any shunt resistor in parallel with a Josephson junction.

12. The biasing network according to claim 1, wherein a first bias element exhibits a maximum average DC voltage $V_{max}$, a second bias element that exhibits a maximum average DC voltage $V_n < V_{max}$, wherein a respective ratio of an average bias current $I_C$ for the first bias element and the second bias element is not proportional to a respective ratio of $V_{max}$ to $V_n$.

13. The biasing network according to claim 12, wherein the second bias element exhibits an average voltage drop of $V_{max} - V_n$.

14. A method of biasing circuit elements in a plurality of parallel circuit branches, comprising:
    distributing a current through a current distribution network to the plurality of parallel circuit branches;
    providing a respective bias element for each respective circuit branch, each respective bias element comprising at least one Josephson junction having a critical current $I_C$ connected in series with at least one inductor, effective for biasing the respective circuit branch with a bias current $I_n$ and for critically damping at least one Josephson junction within the respective circuit branch;
    communicating the respective bias current $I_n$ from the current distribution network, through each respective bias element, to respective circuit elements in each respective circuit branch, such that each respective circuit branch is supplied with a respective bias current $I_n$ and at least one Josephson junction within the respective circuit branch is critically damped by the respective bias element substantially without a shunt damping impedance within the respective circuit branch for damping the at least one Josephson junction within that respective branch.

15. The method according to claim 14, wherein each bias element has a respective inductance $L_n$ such that the respective bias current $I_n$ of each respective circuit branch is inversely proportional to $L_n$, where $L_n I_n$ is greater than $\Phi_0 = h/2e = 2$ mA-pH.

16. The method according to claim 15, wherein a plurality of respective circuit branches comprise single flux quantum logic circuits, further comprising communicating an output of the single flux quantum logic circuits.

17. The method according to claim 14, wherein at least one first circuit element in a first respective circuit branch has a different respective average operating voltage and average operating current than at least one second circuit element in a second respective circuit branch, wherein the respective bias element for each respective branch operates as a current limiter.

18. The method according to claim 14, wherein the at least one inductor for each respective circuit branch is a superconducting inductor.

19. The method according to claim 14, further comprising turning on and off at least one circuit branch such that it selectively operates when turned on.

20. A superconducting integrated circuit, comprising:
- a plurality of superconducting circuit elements, each being biased below a critical current for a respective superconducting Josephson junction logic element within the respective circuit element; and
- a biasing network comprising a plurality of bias elements in parallel, configured to dynamically critically bias the plurality of superconducting circuit elements, while substantially isolating a dynamic bias state for each of the plurality of superconducting circuit elements from others of the plurality of superconducting circuit elements, each bias element being configured to receive a bias current from a current source and pass the bias current through at least one inductor and at least one bias Josephson junction, the bias current for each respective bias element being dependent on a critical current of the respective bias Josephson junction,
- wherein the plurality of superconducting circuit elements are configured to operate in a stable operating regime over a range of data sequences input to the superconducting integrated circuit and fed to the plurality of superconducting circuit elements.

* * * * *